(12) United States Patent
Kojo et al.

(10) Patent No.: US 11,515,857 B2
(45) Date of Patent: Nov. 29, 2022

(54) PIEZOELECTRIC RESONATOR DEVICE

(71) Applicant: Daishinku Corporation, Kakogawa (JP)

(72) Inventors: Takuya Kojo, Kakogawa (JP); Satoru Ishino, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 1361 days.

(21) Appl. No.: 15/552,498

(22) PCT Filed: Jan. 6, 2016

(86) PCT No.: PCT/JP2016/050263
§ 371 (c)(1),
(2) Date: Aug. 22, 2017

(87) PCT Pub. No.: WO2016/136283
PCT Pub. Date: Sep. 1, 2016

(65) Prior Publication Data
US 2018/0034442 A1    Feb. 1, 2018

(30) Foreign Application Priority Data

Feb. 26, 2015  (JP) .............................. JP2015-036708

(51) Int. Cl.
*H03H 9/10* (2006.01)
*H03H 9/17* (2006.01)
(Continued)

(52) U.S. Cl.
CPC ............. *H03H 9/132* (2013.01); *H01L 41/23* (2013.01); *H01L 41/316* (2013.01); *H03H 3/04* (2013.01);
(Continued)

(58) Field of Classification Search
CPC ........ H03H 9/132; H03H 3/04; H03H 9/0523; H03H 9/0595; H03H 9/10; H03H 9/17; H03H 9/1035; H01L 41/23; H01L 41/316
See application file for complete search history.

(56) References Cited

U.S. PATENT DOCUMENTS 6,373,169 B1 * 4/2002 Wajima ............... H03H 9/0514
310/366
2008/0150398 A1  6/2008 Yoshimatsu et al.
(Continued)

FOREIGN PATENT DOCUMENTS

JP    2004-22840 A    1/2004
JP    2008-178071 A   7/2008
(Continued)

*Primary Examiner* — Shawki S Ismail
*Assistant Examiner* — Karen B Addison
(74) *Attorney, Agent, or Firm* — Metrolex IP Law Group, PLLC

(57) ABSTRACT

A third through hole is formed in a crystal resonator plate of a crystal resonator to penetrate between a first main surface and a second main surface. A through electrode of the third through hole is conducted to a first excitation electrode. A seventh through hole is formed in a first sealing member of the crystal resonator to penetrate between a first main surface and a second main surface. The through electrode of the third through hole is conducted to the through electrode of the seventh through hole. The third through hole is not superimposed to the seventh through hole in plan view.

16 Claims, 13 Drawing Sheets

(51) Int. Cl.
  *H01L 41/23* (2013.01)
  *H01L 41/316* (2013.01)
  *H03H 3/04* (2006.01)
  *H03H 9/02* (2006.01)
  *H03H 9/19* (2006.01)
  *H03H 9/13* (2006.01)
  *H03H 9/05* (2006.01)
  *H03H 3/02* (2006.01)

(52) U.S. Cl.
  CPC ...... *H03H 9/02125* (2013.01); *H03H 9/0523* (2013.01); *H03H 9/0547* (2013.01); *H03H 9/0595* (2013.01); *H03H 9/10* (2013.01); *H03H 9/1035* (2013.01); *H03H 9/17* (2013.01); *H03H 9/131* (2013.01); *H03H 9/19* (2013.01); *H03H 2003/022* (2013.01); *H03H 2003/0442* (2013.01)

(56) References Cited

U.S. PATENT DOCUMENTS

| | | |
|---|---|---|
| 2013/0193807 A1 | 8/2013 | Mizusawa |
| 2013/0221808 A1 | 8/2013 | Morimoto et al. |
| 2018/0076790 A1* | 3/2018 | Kojo ................ H01L 41/316 |

FOREIGN PATENT DOCUMENTS

| | | |
|---|---|---|
| JP | 2008-182665 A | 8/2008 |
| JP | 2009-010864 A | 1/2009 |
| JP | 2009-260845 A | 11/2009 |
| JP | 2010-147824 A | 7/2010 |
| JP | 2013-157831 A | 8/2013 |
| JP | 2013-254855 A | 12/2013 |
| KR | 10-2013-0141615 A | 12/2013 |

\* cited by examiner

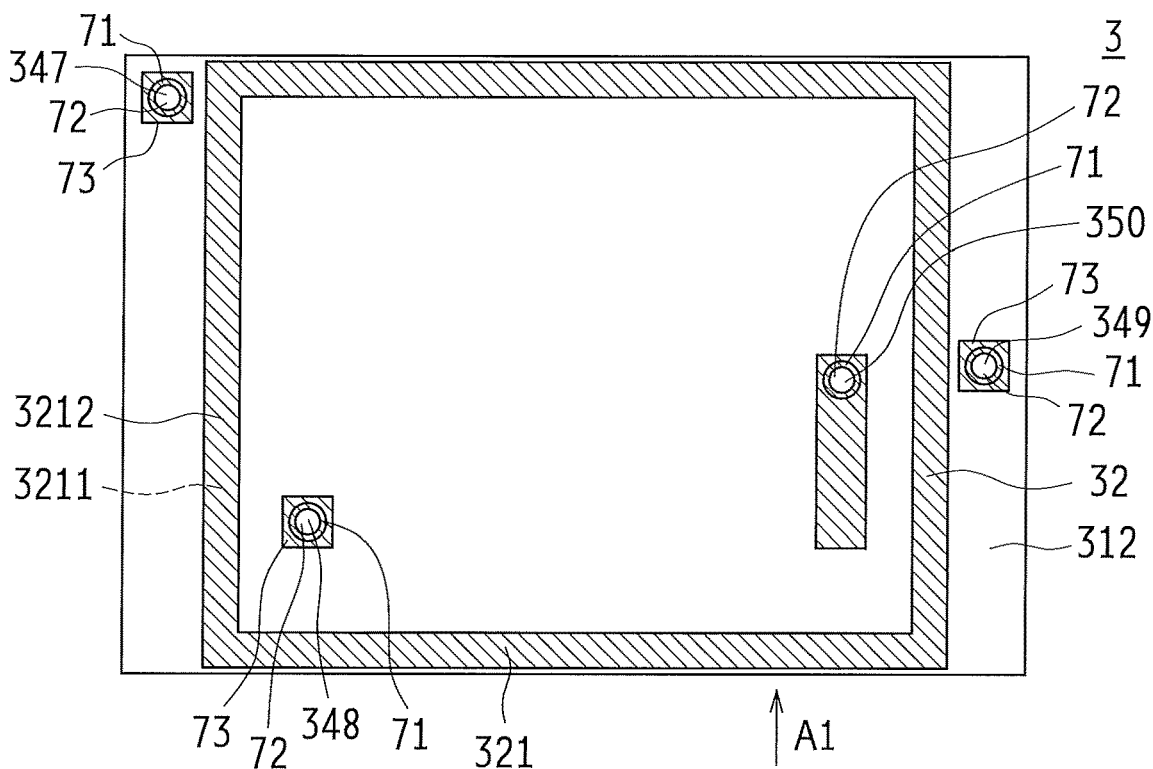
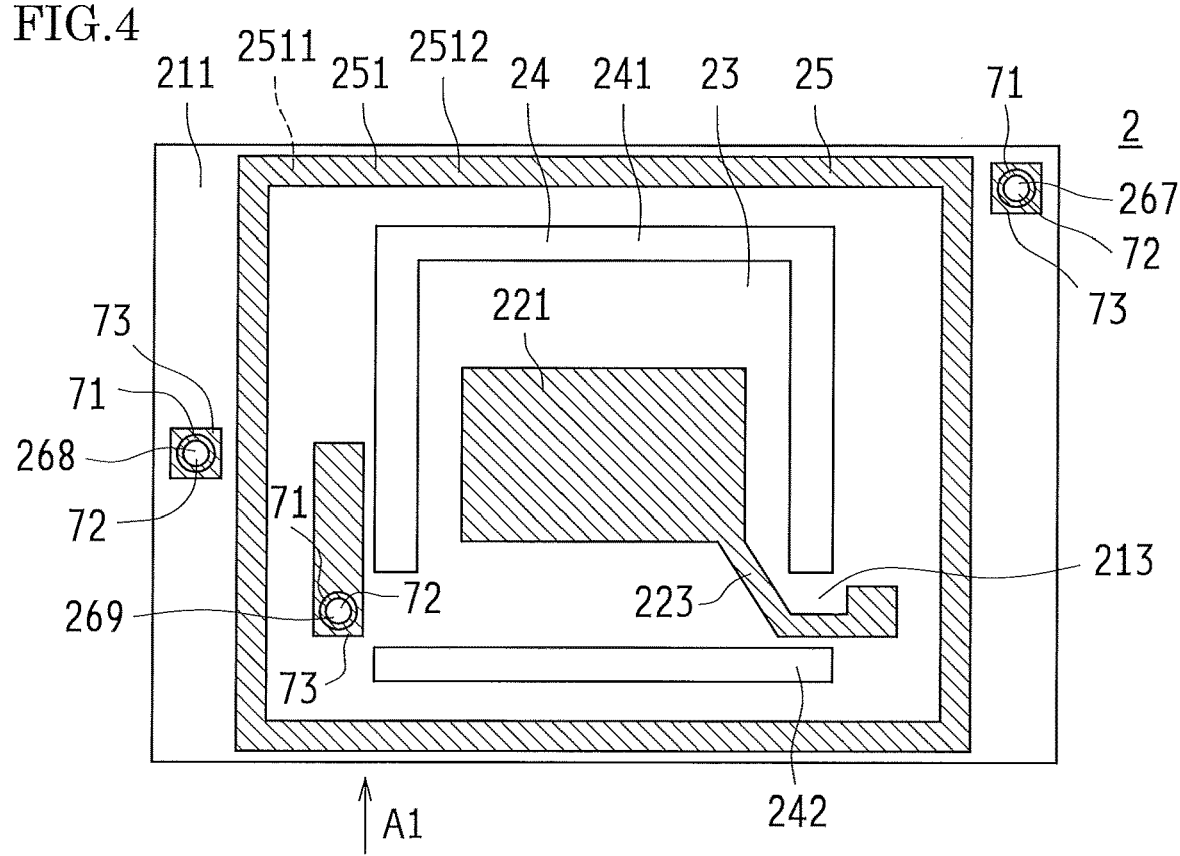

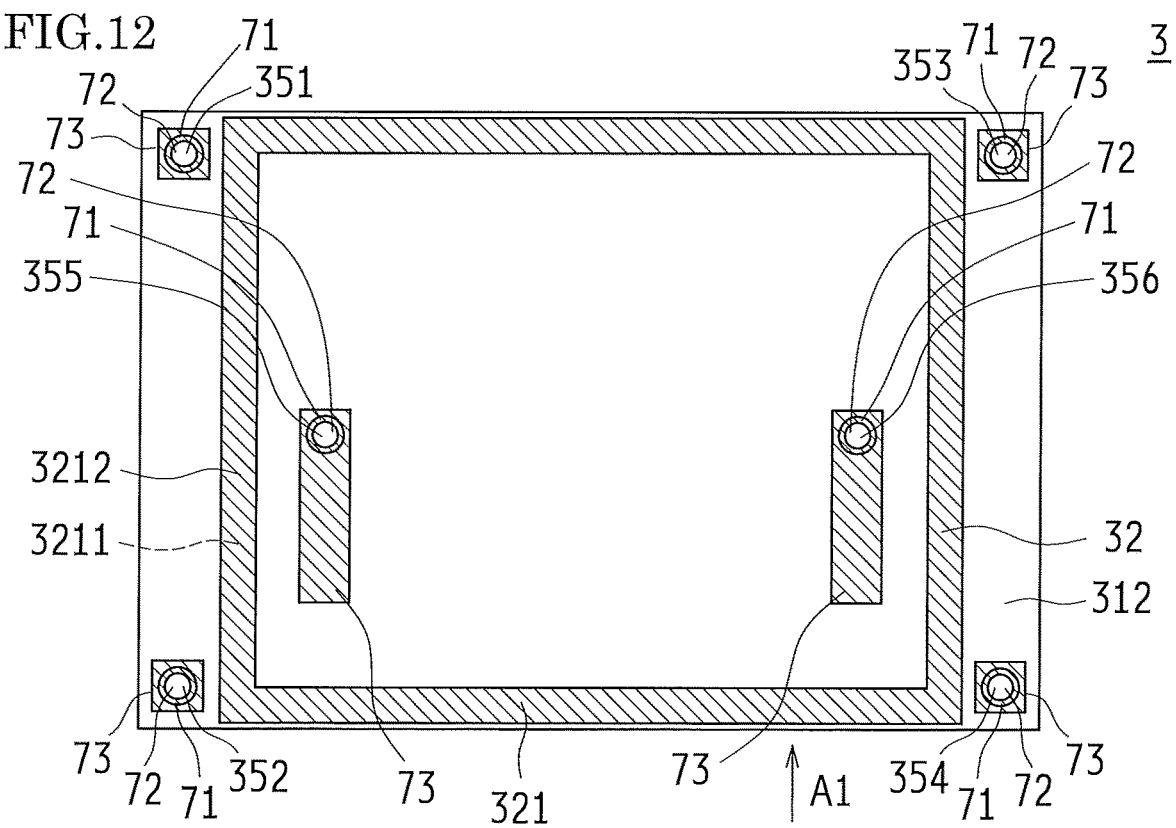
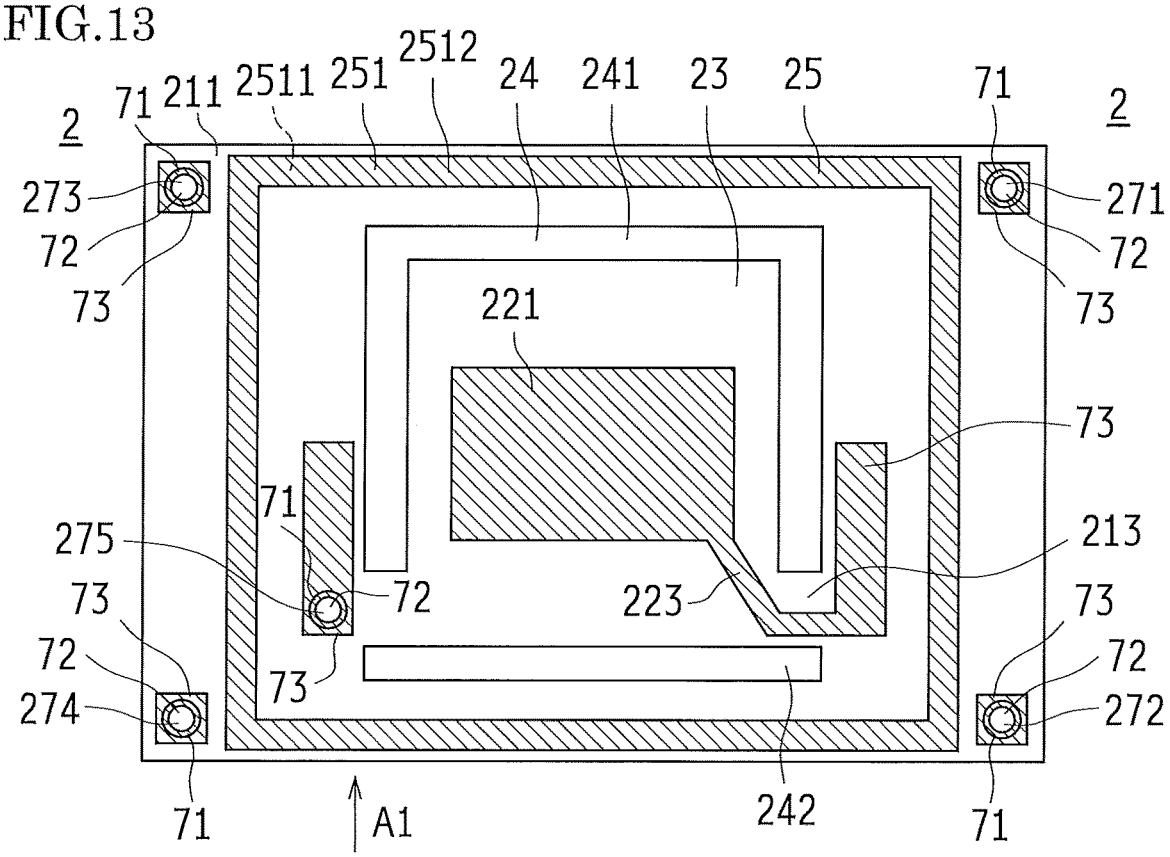

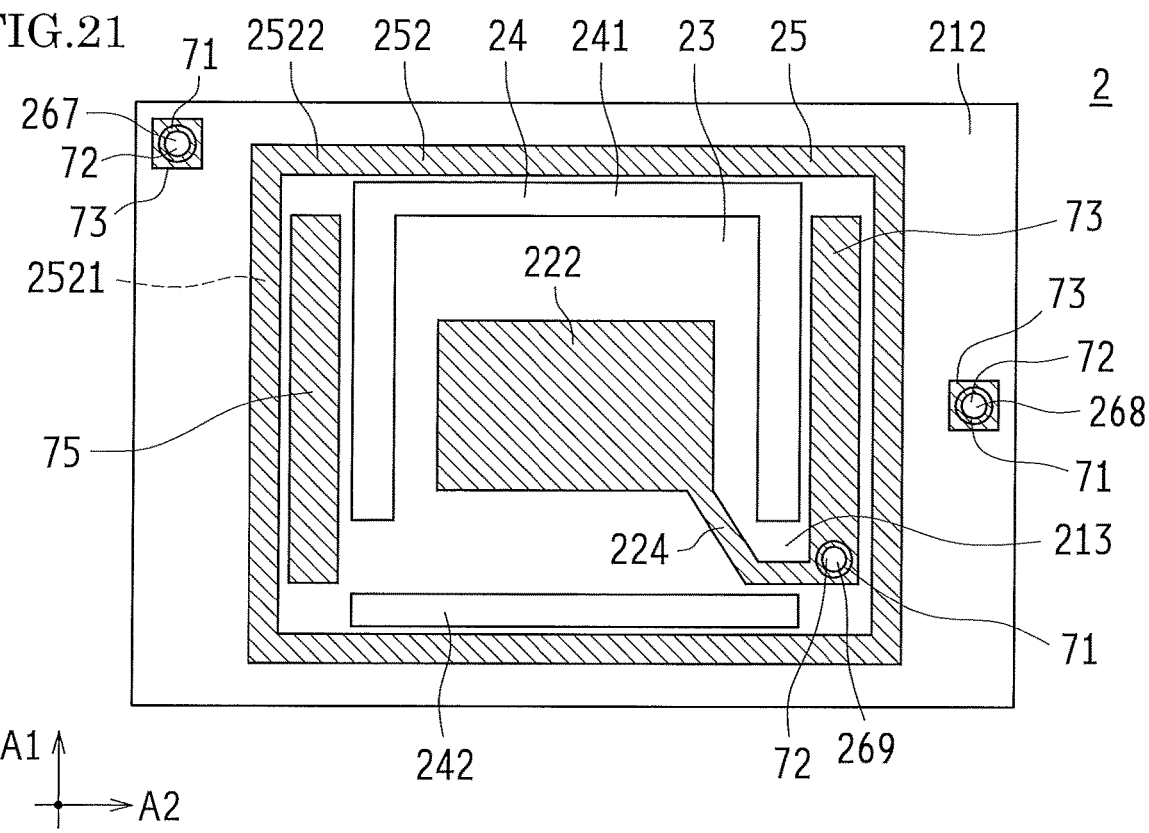
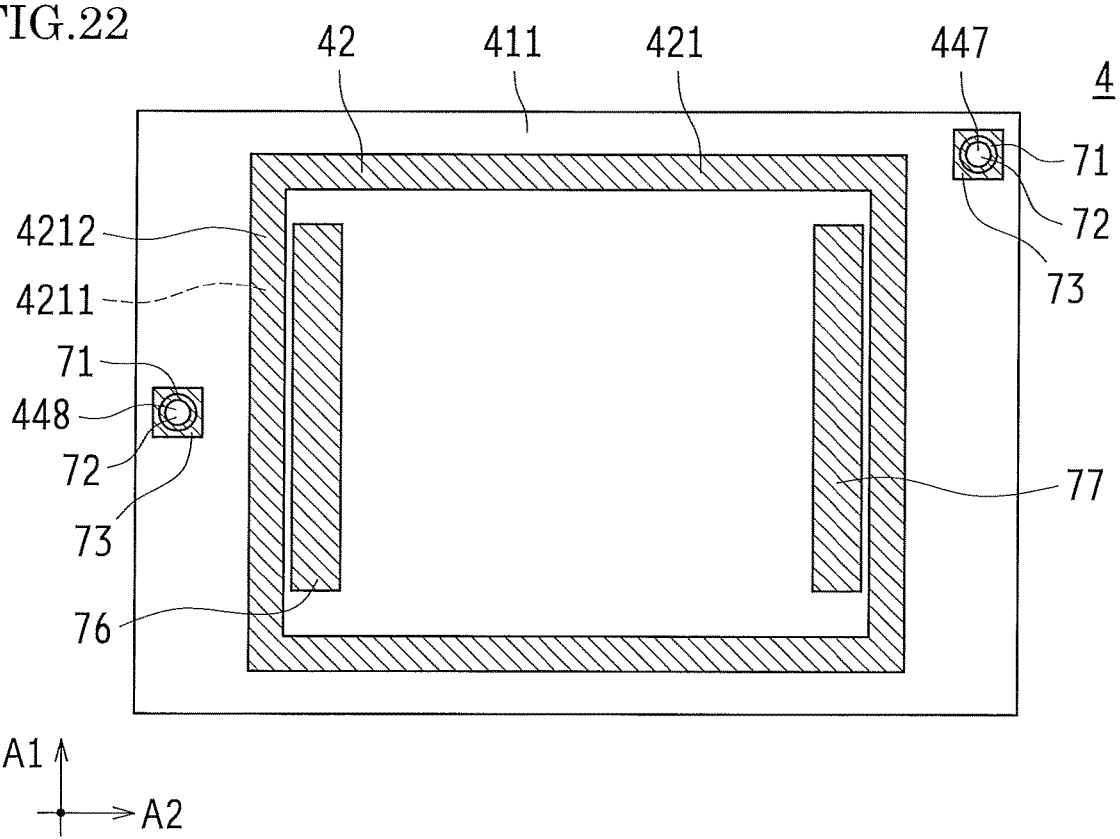

PIEZOELECTRIC RESONATOR DEVICE

TECHNICAL FIELD

The present invention relates to piezoelectric resonator devices.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (crystal resonators, for example) to be adaptable to the increase in operating frequency and the reduction in package size.

In this kind of piezoelectric resonator devices, a housing is constituted by a rectangular-shaped package. The package is constituted by: a first sealing member and a second sealing member both made of glass or crystal; and a crystal resonator plate made of crystal. On respective main surfaces of the crystal resonator plate, excitation electrodes are formed. The first sealing member and the second sealing member are laminated and bonded via the crystal resonator plate. Thus, the excitation electrodes of the crystal resonator plate that is disposed in the package (in the internal space) are hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2013-254855 A

SUMMARY OF THE INVENTION

Problem to Be Solved by the Invention

In the conventional piezoelectric resonator devices, it is necessary to ensure hermeticity of the internal space of the package in which a vibrating part of the piezoelectric resonator plate is sealed. However, such a requirement may cause problems stated below.

For example, there is a case in which the piezoelectric resonator plate and the first sealing member are respectively provided with through holes in an inward position of the internal space in plan view so as to form electrodes (through electrodes) in respective inner peripheral surfaces of the through holes. In this case, when the through holes of the piezoelectric resonator plate are superimposed to the through holes of the first sealing member in plan view, there is a possibility that leakage points (i.e., between the piezoelectric resonator plate and the first sealing member, and between the piezoelectric resonator plate and the second sealing member) increase, which may cause poor hermeticity of the internal space unless the through holes are filled with a metal and the like.

Also, there is a case in which the sealing part (sealing pattern) that hermetically seals the vibrating part of the piezoelectric resonator plate is electrically connected to the excitation electrode of the piezoelectric resonator plate. In this case, a parasitic capacity (stray capacity) is generated because of the connection of the excitation electrode and the sealing part, which may decrease the frequency variation amount of the piezoelectric resonator device.

The present invention was made in consideration of the above problems, an object of which is to provide a piezoelectric resonator device having a sandwich structure that is capable of improving reliability while ensuring the hermeticity of the internal space in which the vibrating part of the piezoelectric resonator plate is sealed.

Means for Solving the Problem

In order to resolve the above problems, the present invention provides a piezoelectric resonator device having a configuration as described below. That is, in the present invention, the piezoelectric resonator device includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate. Through holes for the piezoelectric resonator plate are formed in the piezoelectric resonator plate so as to penetrate between the first main surface and the second main surface. The through holes for the piezoelectric resonator plate include: respective through electrodes for establishing conduction between electrodes formed on the first main surface and the second main surface; and respective through parts. The through electrodes are conducted to either one of the first excitation electrode and the second excitation electrode. Through holes for the first sealing member are formed in the first sealing member so as to penetrate between a first main surface and a second main surface thereof. The through holes for the first sealing member include: respective through electrodes for establishing conduction between electrodes formed on the first main surface and the second main surface; and respective through parts. The through electrodes of the through holes for the piezoelectric resonator plate are conducted to the through electrodes of the through holes for the first sealing member while the through holes for the piezoelectric resonator plate are not superimposed to the through holes for the first sealing member in plan view.

According to the above configuration, it is possible to ensure the hermeticity of the internal space in which the vibrating part of the piezoelectric resonator plate is hermetically sealed without the necessity of filling the through parts of the through holes for the piezoelectric resonator plate and the through holes for the first sealing member with a metal and the like. That is, if the respective through parts of the through holes for both members (i.e. the piezoelectric resonator plate and the first sealing member) are superimposed to each other in plan view, the parts that require to be sealed may increase in order to ensure the hermeticity of the internal space. And if the respective through parts of the through holes for both members are not filled with a metal and the like, such a condition may cause poor hermeticity of the internal space. On the other hand, in the above configuration, the respective through parts of the through holes for both members are arranged so as to not be superimposed to each other in plan view. Thus, even when the respective through parts of the through holes for both members are not filled with a metal and the like, it is possible to ensure the hermeticity of the internal space in which the vibrating part of the piezoelectric resonator plate is hermetically sealed. Therefore, it is possible for the piezoelectric resonator device having the sandwich structure to improve reliability while ensuring the hermeticity of the internal space in which the vibrating part of the piezoelectric resonator plate is sealed.

In the above configuration, the through electrodes of the through holes for the piezoelectric resonator plate may be conducted to the through electrodes of the through holes for the first sealing member by bonding a bonding pattern formed on the first main surface of the piezoelectric resonator plate so as to surround the through hole for the piezoelectric resonator plate to a bonding pattern formed on the second main surface of the first sealing member so as to surround the through holes for the first sealing member.

According to the above configuration, the bond of the respective connection bonding patterns covers the space between the piezoelectric resonator plate and the first sealing member, thus it is possible to improve the hermeticity of the internal space. Also, the bond of the respective connection bonding patterns establishes conduction between the respective through electrodes of the through holes for both members (i.e. the piezoelectric resonator plate and the first sealing member), thus it is possible to ensure electrical connection between the respective through electrodes of the through holes for both members.

In the above configuration, the bonding pattern of the piezoelectric resonator plate may be constituted by a base PVD film deposited on the first main surface of the piezoelectric resonator plate by physical vapor deposition, and an electrode PVD film deposited on the base PVD film by physical vapor deposition. The bonding pattern of the first sealing member may be constituted by a base PVD film deposited on the second main surface of the first sealing member by physical vapor deposition, and an electrode PVD film deposited on the base PVD film by physical vapor deposition. The above bonding patterns may be bonded to each other by diffusion bonding.

According to the above configuration, the bond of the respective connection bonding patterns establishes conduction between the respective through electrodes of the through holes for both members (i.e. the piezoelectric resonator plate and the first sealing member). Thus, the respective through parts of the through holes for both members are covered by a bonding material formed upon bonding of the bonding patterns, which improves the hermeticity of the internal space and ensures the electrical connection between the through electrodes of the through holes for both members. Also, it is possible to suppress variation in the height of the package of the piezoelectric resonator device. For example, unlike the above configuration, when using a metal paste sealing material such as a Sn-containing bonding material, the variation in the height occurs when the metal paste sealing material is formed on the bonding patterns. Furthermore, after bonding, due to heat capacity distribution in the formed bonding patterns (bonding material), the even gaps are not formed. Therefore, in the conventional art, when three members (i.e., the first sealing member, the second sealing member and the piezoelectric resonator plate) are laminated, the respective gaps between the members are different. As a result, the laminated three members are bonded in a state in which they are not parallel to each other. This problem becomes remarkable according to the reduction in package height. On the other hand, in the above configuration, the three members (i.e., the first sealing member, the second sealing member and the piezoelectric resonator plate) can be laminated and bonded in a state in which they are parallel to each other, thus, the above configuration can be adaptable to the height reduction of the package. That is, in the above configuration, it is possible to provide the piezoelectric resonator device having a thin thickness and a superior dimensional accuracy even when the height of the package is reduced. Furthermore, since the variation in the inter-layer capacity of the piezoelectric resonator device can be reduced, it is possible to suppress the variation in the frequency caused by the variation in the inter-layer capacity.

Also, the present invention provides a piezoelectric resonator device that includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate, and an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate. And furthermore, in this piezoelectric resonator device, the first excitation electrode and the second excitation electrode are not electrically connected to sealing parts that hermetically seal the vibrating part of the piezoelectric resonator plate.

According to the above configuration, the excitation electrodes (the first excitation electrode and the second excitation electrode) are electrically independent, respectively, from the sealing parts. Thus, it is possible to suppress the generation of the parasitic capacity (stray capacity) due to the sealing parts, which ensures a large frequency variation amount of the piezoelectric resonator device. As a result, it is possible for the piezoelectric resonator device having the sandwich structure to improve reliability while ensuring, by the sealing parts, the hermeticity of the internal space in which the vibrating part of the piezoelectric resonator plate is sealed.

In the above configuration, a through hole for the piezoelectric resonator plate may be formed in the piezoelectric resonator plate so as to penetrate between the first main surface and the second main surface, the through hole for the piezoelectric resonator plate including: a through electrode for establishing conduction between electrodes formed on the first main surface and the second main surface; and a through part, and the through electrode may be conducted to the second excitation electrode. A through hole for the first sealing member may be formed in the first sealing member so as to penetrate between a first main surface and a second main surface thereof, the through hole for the first sealing member including: a through electrode for establishing conduction between electrodes formed on the first main surface and the second main surface; and a through part, and the through electrode may be conducted to the first excitation electrode of the piezoelectric resonator plate. The through hole for the piezoelectric resonator plate and the through hole for the first sealing member may be formed inside the sealing parts in plan view. In this case, another through hole for the first sealing member may be formed in the first sealing member so as to penetrate between the first main surface and the second main surface thereof, the above through hole for the first sealing member including: a through electrode for establishing conduction between electrodes formed on the first main surface and the second main surface; and a through part, and the through electrode may be conducted to a corresponding through electrode of the through hole for the piezoelectric resonator plate. The corresponding through hole for the piezoelectric resonator plate may be arranged so as to not be superimposed to the above through hole for the first sealing member in plan view.

According to the above configuration, the bonding part of the bonding pattern of the through hole for piezoelectric resonator plate and the bonding pattern of the other through hole for the first sealing member is formed inside the sealing parts. Thus, even when distortion stress or the like is applied to the piezoelectric resonator device, the bonding part of the bonding pattern of the through hole for the piezoelectric resonator plate and the bonding pattern of the other through hole for the first sealing member can be protected by the sealing part having a large bonded area. Therefore, it is possible to improve the hermeticity of the internal space. Also, it is possible to ensure the hermeticity of the internal space in which the vibrating part of the piezoelectric resonator plate is hermetically sealed without the necessity of filling the through parts of the through hole for the piezoelectric resonator plate and the other through hole for the first sealing member with a metal and the like. That is, if the respective through parts of the through hole for the piezoelectric resonator plate and the other through hole for the first sealing member are superimposed to each other in plan view, the parts that require to be sealed may increase in order to ensure the hermeticity of the internal space. And if the respective through parts of the through hole for the piezoelectric resonator plate and the other through hole for the first sealing member are not filled with a metal and the like, such a condition may cause poor hermeticity of the internal space. On the other hand, in the above configuration, the respective through parts of the through hole for the piezoelectric resonator plate and the other through hole for the first sealing member are arranged so as to not be superimposed to each other in plan view. Thus, even when the respective through parts of the through hole for the piezoelectric resonator plate and the other through hole for the first sealing member are not filled with a metal and the like, it is possible to ensure the hermeticity of the internal space in which the vibrating part of the piezoelectric resonator plate is hermetically sealed. Therefore, it is possible for the piezoelectric resonator device having the sandwich structure to improve reliability while ensuring the hermeticity of the internal space in which the vibrating part of the piezoelectric resonator plate is sealed.

In the above configuration, at least a first external electrode terminal and a second external electrode terminal may be disposed on the second main surface of the second sealing member so as to be electrically connected to an external circuit board using a flowable conductive bonding material. The first excitation electrode of the piezoelectric resonator plate may be connected to the first external electrode terminal of the second sealing member via a first terminal formed on the first main surface of the first sealing member, and the second excitation electrode of the piezoelectric resonator plate may be connected to the second external electrode terminal of the second sealing member via a second terminal formed on the first main surface of the first sealing member. In this case, a first electrical path and a second electrical path may be formed outside the sealing parts that hermetically seal the vibrating part of the piezoelectric resonator plate in plan view, the first electrical path conducting the first terminal to the first external electrode terminal, and the second electrical path conducting the second terminal to the second external electrode terminal. Also in this case, the first electrical path and the second electrical path are not needed to be electrically connected to the sealing parts.

According to the above configuration, when the external electrode terminals (the first external electrode terminal and the second external electrode terminal) are electrically connected to the external circuit board using the flowable conductive bonding material, the flowable conductive bonding material creeps up from the external electrode terminals to the electrical paths (the first electrical path and the second electrical path). In this case, the hermeticity of the internal space in which the vibrating part of the piezoelectric resonator plate is hermetically sealed may be decreased due to corrosion of the flowable conductive bonding material that creeps up the electrical paths. However, in the above configuration, it is possible to ensure a long distance as the length of the path from the first excitation electrode of the piezoelectric resonator plate to the external electrode terminal (the first external electrode terminal), and as the length of the path from the second excitation electrode of the piezoelectric resonator plate to the external electrode terminal (the second external electrode terminal). Therefore, it is possible to prevent the internal space from being affected by corrosion of the flowable conductive bonding material that decreases the hermeticity.

Also, the electrical paths (the first electrical path and the second electrical path) are positioned spaced apart from the vibrating part of the piezoelectric resonator plate provided inside the sealing parts. Thus, even when the through parts of the electrical paths are filled with the flowable conductive bonding material having a different coefficient of thermal expansion from that of the piezoelectric resonator plate or the like at the time of bonding the piezoelectric resonator device to the external circuit board, it is possible to prevent the generated bonding stress from affecting the vibrating part of the piezoelectric resonator plate.

Also, it is possible to easily test the piezoelectric resonator plate before bonding it to the second sealing member, using the first terminal and the second terminal that are disposed on the first main surface of the first sealing member as test terminals for the piezoelectric resonator plate. Furthermore, the size of the first terminal and the second terminal can be easily changed. Thus, the capacity of the piezoelectric resonator plate viewed from the external electrode terminals (the first external electrode terminal and the second external electrode terminal) can be finely adjusted as required. In the case in which the piezoelectric resonator device is a piezoelectric oscillator, the first terminal and the second terminal can be used as IC mounting pads.

In the above configuration, the first terminal and the second terminal may include respective outer side parts that are positioned outside the internal space in plan view, and the outer side parts may be used as test terminals for the vibrating part of the piezoelectric resonator plate.

According to the above configuration, the test terminals are formed on the respective outer side parts of the first terminal and the second terminal. Thus, it is possible to distribute, from the first sealing member to the piezoelectric resonator plate, the pressure when the inspection probe makes contact with the test terminal, which leads to suppression of the deformation of the first sealing member. In this way, it is possible to prevent the block of the piezoelectric vibration of the vibrating part of the piezoelectric resonator plate or to suppress the change in the stray capacity, both of which are caused by the deformation of the first sealing member.

In the above configuration, the first terminal and the second terminal may be formed on the first main surface of the first sealing member so as to across from the inside to the outside of the sealing parts in plan view. At least the first external electrode terminal and the second external electrode terminal may be disposed on the second main surface of the second sealing member so as to be electrically connected to an external circuit board using a flowable conductive bonding material. The first excitation electrode of the piezoelectric resonator plate may be connected to the first terminal of the first sealing member via a third electrical path disposed inside the sealing parts in plan view, and the first terminal may be connected to the first external electrode terminal of the second sealing member via the first electrical path disposed outside the sealing parts in plan view. The second excitation electrode of the piezoelectric resonator plate may be connected to the second terminal of the second sealing member via a fourth electrical path disposed inside the sealing parts in plan view. The second terminal may be connected to the second external electrode terminal of the second sealing member via the second electrical path disposed outside the sealing parts in plan view.

According to the above configuration, when the external electrode terminals (the first external electrode terminal and the second external electrode terminal) are electrically connected to the external circuit board using the flowable conductive bonding material, the flowable conductive bonding material creeps up from the external electrode terminals to the electrical paths (the first electrical path and the second electrical path). In this case, the hermeticity of the internal space in which the vibrating part of the piezoelectric resonator plate is hermetically sealed may be decreased due to corrosion of the flowable conductive bonding material that creeps up the electrical paths. However, in the above configuration, the path from the first excitation electrode of the piezoelectric resonator plate to the external electrode terminal (the first external electrode terminal) is constituted by the third electrical path, the first terminal and the first electrical path, thus it is possible to ensure a relatively long distance as the length of the path. Also, the path from the second excitation electrode of the piezoelectric resonator plate to the external electrode terminal (the second external electrode terminal) is constituted by the fourth electrical path, the second terminal and the second electrical path, thus it is possible to ensure a relatively long distance as the length of the path. Therefore, it is possible to prevent the internal space from being affected by corrosion of the flowable conductive bonding material that decreases the hermeticity.

Also, the electrical paths (the first electrical path and the second electrical path) are positioned spaced apart from the vibrating part of the piezoelectric resonator plate disposed inside the sealing parts. Thus, even when the through holes of the electrical paths are filled with the flowable conductive bonding material having a different coefficient of thermal expansion from that of the piezoelectric resonator plate or the like at the time of bonding the piezoelectric resonator device to the external circuit board, it is possible to prevent the generated bonding stress from affecting the vibrating part of the piezoelectric resonator plate.

Also, it is possible to easily test the piezoelectric resonator plate before bonding it to the second sealing member, using the first terminal and the second terminal that are disposed on the first main surface of the first sealing member as test terminals for the piezoelectric resonator plate. Furthermore, the size of the first terminal and the second terminal can be easily changed. Thus, the capacity of the piezoelectric resonator plate viewed from the external electrode terminals (the first external electrode terminal and the second external electrode terminal) can be finely adjusted as required. In the case in which the piezoelectric resonator device is a piezoelectric oscillator, the first terminal and the second terminal can be used as IC mounting pads.

In the above configuration, the first terminal and the second terminal may include respective parts that are positioned outside the internal space in plan view, and the parts may be used as test terminals for the vibrating part of the piezoelectric resonator plate.

According to the above configuration, the test terminals are disposed on the respective parts of the first terminal and the second terminal, the parts being outside the internal space. Thus, it is possible to distribute, from the first sealing member to the piezoelectric resonator plate, the pressure when the inspection probe makes contact with the test terminal, which leads to suppression of the deformation of the first sealing member. In this way, it is possible to prevent the block of the piezoelectric vibration of the vibrating part of the piezoelectric resonator plate or to suppress the change in the stray capacity, both of which are caused by the deformation of the first sealing member.

Effects of the Invention

The present invention can provide a piezoelectric resonator device having a sandwich structure that is capable of improving reliability while ensuring the hermeticity of the internal space in which a vibrating part of a piezoelectric resonator plate is sealed.

BRIEF DESCRIPTION OF THE DRAWINGS

FIG. 3 is a schematic rear view illustrating the first sealing member of the crystal resonator according to the embodiment.

FIG. 4 is a schematic plan view illustrating a crystal resonator plate of the crystal resonator according to the embodiment.

FIG. 12 is a schematic rear view illustrating the first sealing member of the crystal oscillator according to the embodiment.

FIG. 13 is a schematic plan view illustrating a crystal resonator plate of the crystal oscillator according to the embodiment.

FIG. 21 is a schematic rear view illustrating the variation of the crystal resonator plate of the crystal resonator.

FIG. 22 is a schematic plan view illustrating a variation of the second sealing member of the crystal resonator.

MEANS FOR CARRYING OUT THE INVENTION

Hereinafter, an embodiment of the present invention will be described with reference to the drawings. In the following embodiment, the present invention is applied to a crystal resonator as a piezoelectric resonator device that causes piezoelectric vibration.

Crystal Resonator

Figure 1:
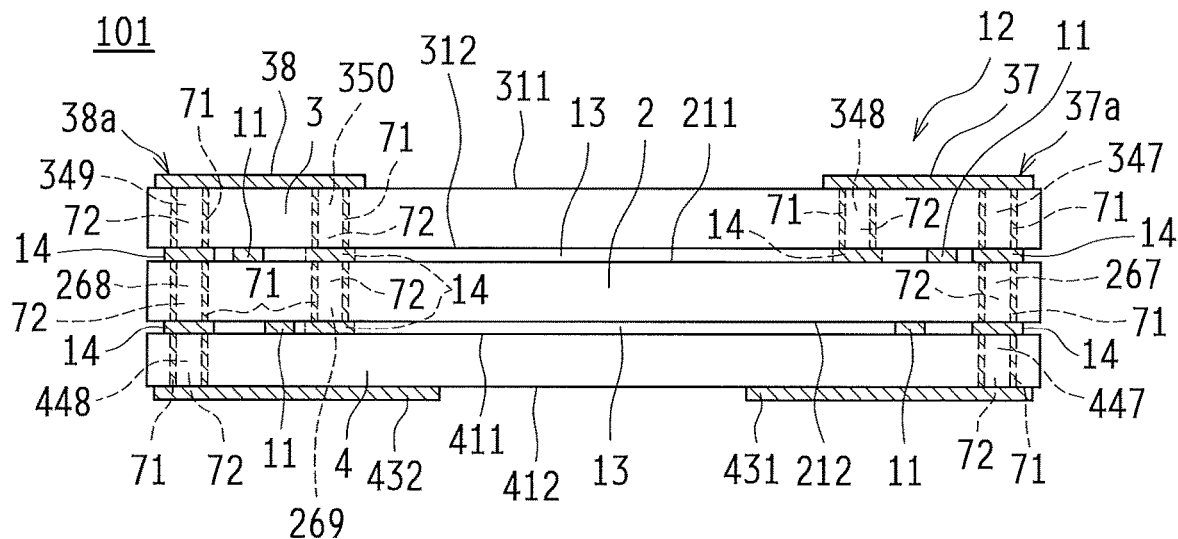
FIG. 1 is a schematic configuration diagram illustrating a configuration of a crystal resonator according to an embodiment.

As shown in FIG. 1, a crystal resonator 101 according to this embodiment includes: a crystal resonator plate 2 (a piezoelectric resonator plate in the present invention); a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member 4 disposed on a second main surface 212 of the crystal resonator plate 2 so as to cover a second excitation electrode 222 (see FIG. 5) of the crystal resonator plate 2, the second sealing member 4 for hermetically sealing the second excitation electrode 222 that makes a pair with the first excitation electrode 221. In the crystal resonator 101, the crystal resonator plate 2 is bonded to the first sealing member 3, and also the crystal resonator plate 2 is bonded to the second sealing member 4. Thus, a package 12 having a sandwich structure is constituted.

An internal space 13 of the package 12 is formed by bonding the first sealing member 3 to the second sealing member 4 via the crystal resonator plate 2. In this internal space 13 of the package 12, a vibrating part 23 is hermetically sealed. The vibrating part 23 includes the first excitation electrode 221 and the second excitation electrode 222 respectively formed on both main surfaces 211 and 212 of the crystal resonator plate 2. The crystal resonator 101 according to this embodiment has, for example, a package size of 1.0×0.8 mm, which is reduced in size and height. According to the size reduction, no castellation is formed in the package 12. Through holes (first through ninth through holes) are used for conduction between electrodes.

Next, the configuration of the above-described crystal resonator 101 will be described referring to FIGS. 1 to 7. Here, each of the crystal resonator plate 2, the first sealing member 3 and the second sealing member 4 will be described as a single body without being bonded.

Figure 5:
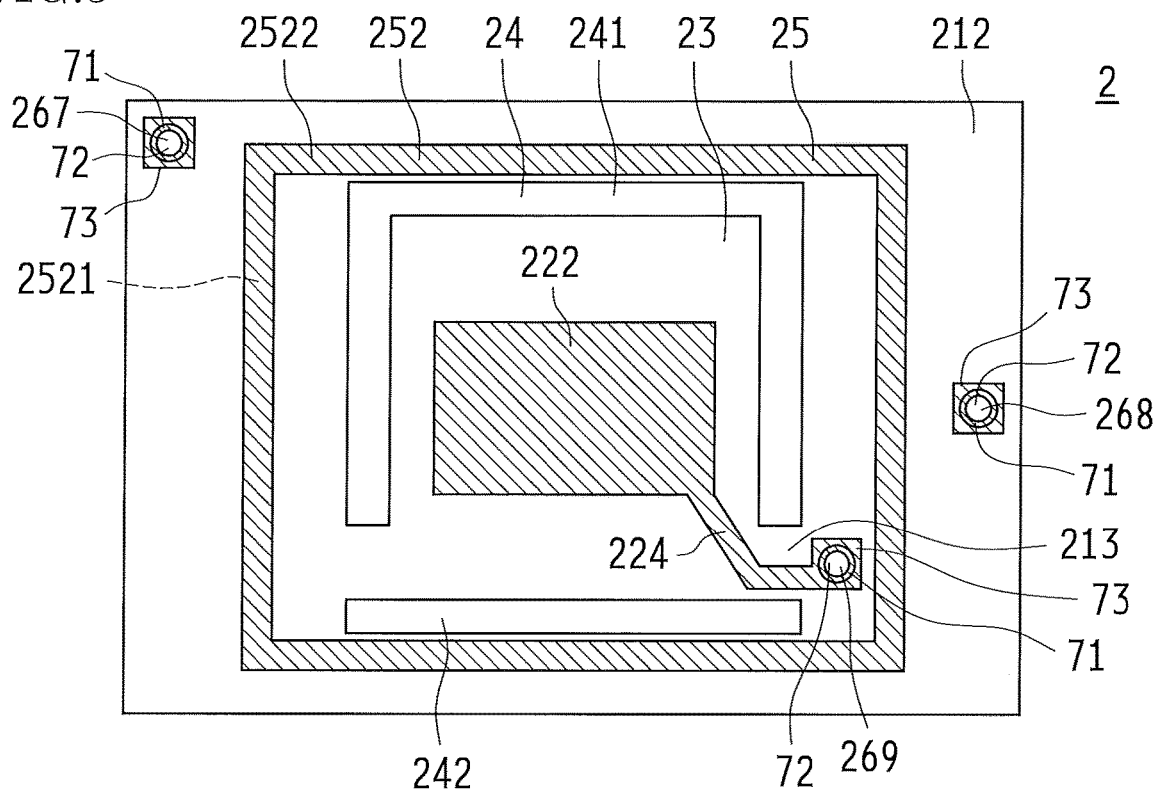
FIG. 5 is a schematic rear view illustrating the crystal resonator plate of the crystal resonator according to the embodiment.

As shown in FIGS. 4 and 5, the crystal resonator plate 2 is made of a crystal as a piezoelectric material. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on the main surfaces 211 and 212 (the first main surface 211 and the second main surface 212) of the crystal resonator plate 2. Also, in the main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by a squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and an oblong rectangular shaped part 242 in plan view. On parts 213 between the squared U-shaped part 241 in plan view and the oblong rectangular shaped part 242 in plan view, extraction electrodes (a first extraction electrode 223 and a second extraction electrode 224) are disposed so as to extract the first excitation electrode 221 and the second excitation electrode 222 to external electrode terminals (a first external electrode terminal 431 and a second external electrode terminal 432). The first excitation electrode 221 and the first extraction electrode 223 are constituted by a base PVD film deposited on the first main surface 211 by physical vapor deposition, and an electrode PVD film deposited on the base PVD film by the physical vapor deposition. The second excitation electrode 222 and the second extraction electrode 224 are constituted by a base PVD film deposited on the second main surface 212 by the physical vapor deposition, and an electrode PVD film deposited on the base PVD film by the physical vapor deposition.

In the crystal resonator plate 2, the respective resonator-plate-side sealing parts 25 for bonding the first sealing member 3 and the second sealing member 4 are provided on outward positions along the vibrating part 23 of both main surfaces 211 and 212 so as to surround the vibrating part 23. On the resonator-plate-side sealing part 25 on the first main surface 211 of the crystal resonator plate 2, a resonator-plate-side first bonding pattern 251 is formed to be bonded to the first sealing member 3. Also, on the resonator-plate-side sealing part 25 on the second main surface 212 of the crystal resonator plate 2, a resonator-plate-side second bonding pattern 252 is formed to be bonded to the second sealing member 4. The resonator-plate-side first bonding pattern 251 and the resonator-plate-side second bonding pattern 252 are each formed so as to have an annular shape in plan view. The internal space 13 is formed in an inward position (inside) of the resonator-plate-side first bonding pattern 251 and the resonator-plate-side second bonding pattern 252 in plan view. Here, the inward position of the internal space 13 means strictly the inner side of respective inner peripheral surfaces of bonding materials 11 (described later), not including the positions on the bonding materials 11. The first excitation electrode 221 of the crystal resonator plate 2 is not electrically connected to the resonator-plate-side first bonding pattern 251, and the second excitation electrode 222 of the crystal resonator plate 2 is not electrically connected to the resonator-plate-side second bonding pattern 252.

The resonator-plate-side first bonding pattern 251 is constituted by a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted by a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 in the same process. Similarly to the above, the second excitation electrode 222, the second extraction electrode 224 and the resonator-plate-side second bonding pattern 252 can have the same configuration. In this case, it is possible to form collectively the second excitation electrode 222, the second extraction electrode 224 and the resonator-plate-side second bonding pattern 252 in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 4 and 5, three through holes (first through third through holes 267 through 269) are formed in the crystal resonator plate 2 so as to penetrate between the first main surface 211 and the second main surface 212. The first through hole 267 is connected to a fourth through hole 347 of the first sealing member 3 and to an eighth through hole 447 of the second sealing member 4. The second through hole 268 is connected to a sixth through hole 349 of the first sealing member 3 and to a ninth through hole 448 of the second sealing member 4. The third through hole 269 is connected to the second extraction electrode 224 extracted from the second excitation electrode 222 and to a seventh through hole 350 of the first sealing member 3 via a bonding material 14 described later. The first through hole 267 and the second through hole 268 are located at respective end parts of the crystal resonator plate 2 in the longitudinal direction in plan view.

In each of the first through third through holes 267 through 269, a through electrode 71 is formed along a corresponding inner wall surface of the first through third through holes 267 through 269 so as to establish conduction between electrodes formed on the first main surface 211 and the second main surface 212, as shown in FIGS. 1, 4 and 5. Each central part of the first through third through holes 267 through 269 is a hollow through part 72 penetrating between the first main surface 211 and the second main surface 212. A connection bonding pattern 73 is formed on each outer periphery of the first through third through holes 267 through 269. The respective connection bonding patterns 73 are formed on both main surfaces (the first main surface 211 and the second main surface 212) of the crystal resonator plate 2. The connection bonding patterns 73 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connection bonding pattern 73 is constituted by a base PVD film deposited on each main surface (the first main surface 211 and the second main surface 212) of the crystal resonator plate 2 by the physical vapor deposition, and an electrode PVD film deposited on the base PVD film by the physical vapor deposition. The connection bonding pattern 73 of the third through hole 269 formed on the first main surface 211 of the crystal resonator plate 2 extends along the direction indicated by the arrow A1 in FIG. 4, and is formed between the resonator-plate-side first bonding pattern 251 and the cut-out part 24. The connection bonding pattern 73 of the third through hole 269 formed on the second main surface 212 of the crystal resonator plate 2 is integrally formed with the second extraction electrode 224 that is extracted from the second excitation electrode 222.

In the crystal resonator 101, the first through hole 267 and the second through hole 268 are formed in the outward position of the internal space 13 (outside of the respective outer peripheral surfaces of the bonding materials 11) in plan view. In contrast, the third through hole 269 is formed in the inward position of the internal space 13 (inside of the respective inner peripheral surfaces of the bonding materials 11) in plan view. The first through third through holes 267 through 269 are electrically connected to neither the resonator-plate-side first bonding pattern 251 nor the resonator-plate-side second bonding pattern 252.

Figure 2:
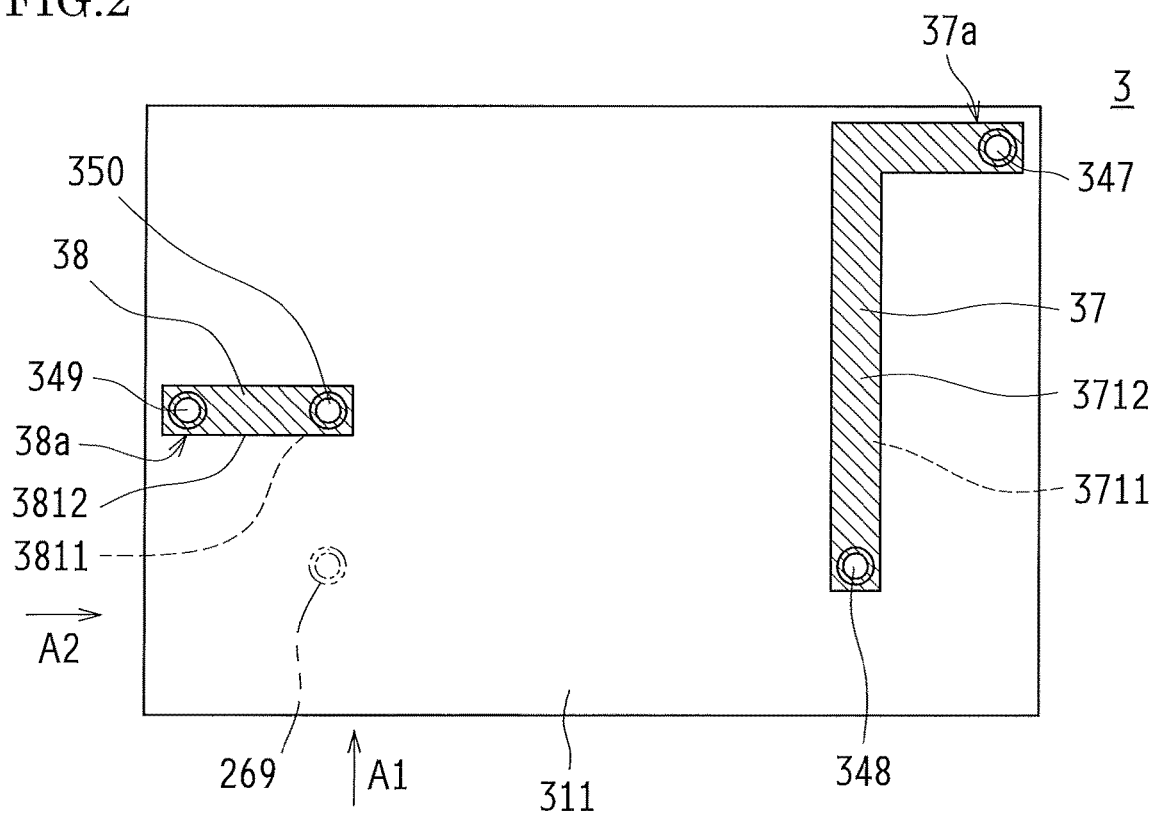
FIG. 2 is a schematic plan view illustrating a first sealing member of the crystal resonator according to the embodiment.

The first sealing member 3 is made of a material having the flexural rigidity (moment of inertia of area×Young's modulus) of not more than 1000 [N·mm²]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. On the sealing-member-side first sealing part 32 of the first sealing member 3, a sealing-member-side first bonding pattern 321 is formed so as to be bonded to the crystal resonator plate 2. The sealing-member-side first bonding pattern 321 is formed so as to have an annular shape in plan view. The sealing-member-side first bonding pattern 321 has the same width at all positions on the sealing-member-side first sealing part 32 of the first sealing member 3.

The sealing-member-side first bonding pattern 321 is constituted by a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

On a first main surface 311 (the outer main surface not facing the crystal resonator plate 2) of the first sealing member 3, a first terminal 37 and a second terminal 38 are disposed. The first terminal 37 is to connect the fourth through hole 347 to a fifth through hole 348. The second terminal 38 is to connect the sixth through hole 349 to the seventh through hole 350. The first terminal 37 and the second terminal 38 are constituted respectively by base PVD films 3711 and 3811 deposited on the first main surface 311 by the physical vapor deposition, and electrode PVD films 3712 and 3812 deposited respectively on the base PVD films 3711 and 3811 by the physical vapor deposition. In this embodiment, the first terminal 37 and the second terminal 38 are located at respective end parts of the first main surface 311 of the first sealing member 3 in the longitudinal direction in plan view.

As shown in FIGS. 1 to 3, four through holes (the fourth through seventh through holes 347 through 350) are formed in the first sealing member 3 so as to penetrate between the first main surface 311 and the second main surface 312. The fourth through hole 347 is connected to the first terminal 37 and to the first through hole 267 of the crystal resonator plate 2. The fifth through hole 348 is connected to the first terminal 37 and to the first extraction electrode 223 extracted from the first excitation electrode 221 of the crystal resonator plate 2. The sixth through hole 349 is connected to the second terminal 38 and to the second through hole 268 of the crystal resonator plate 2. The seventh through hole 350 is connected to the second terminal 38 and to the third through hole 269 of the crystal resonator plate 2. The fourth through hole 347 and the sixth through hole 349 are located at respective end parts of the first sealing member 3 in the longitudinal direction in plan view.

In each of the fourth through seventh through holes 347 through 350, the through electrode 71 is formed along a corresponding inner wall surface of the fourth through seventh through holes 347 through 350 so as to establish conduction between electrodes formed on the first main surface 311 and the second main surface 312, as shown in FIGS. 1 to 3. Each central part of the fourth through seventh through holes 347 through 350 is the hollow through part 72 penetrating between the first main surface 311 and the second main surface 312. The connection bonding pattern 73 is formed on each outer periphery of the fourth through seventh through holes 347 through 350. The connection bonding patterns 73 are formed on the second main surface 312 of the first sealing member 3. The connection bonding patterns 73 have the same configuration as the sealing-member-side first bonding pattern 321, accordingly, they can be formed by the same process as that for the sealing-member-side first bonding pattern 321. Specifically, each connection bonding pattern 73 is constituted by a base PVD film deposited on the second main surface 312 of the first sealing member 3 by the physical vapor deposition, and an electrode PVD film deposited on the base PVD film by the physical vapor deposition. The connection bonding pattern 73 of the seventh through hole 350 extends along the direction indicated by the arrow A1 in FIG. 3.

In the crystal resonator 101, the fourth through hole 347 and the sixth through hole 349 are formed outside the internal space 13 in plan view. In contrast, the fifth through hole 348 and the seventh through hole 350 are formed inside the internal space 13 in plan view. The fourth through seventh through holes 347 through 350 are not electrically connected to the sealing-member-side first bonding pattern 321. Also, the first terminal 37 and the second terminal 38 are not electrically connected to the sealing-member-side first bonding pattern 321. The first terminal 37 and the second terminal 38 are formed so as to extend from the inside to the outside of the bonding materials 11 in plan view. That is, the first terminal 37 and the second terminal 38 are formed across the bonding materials 11 (i.e. so as to intersect with the bonding materials 11) in plan view.

Figure 6:
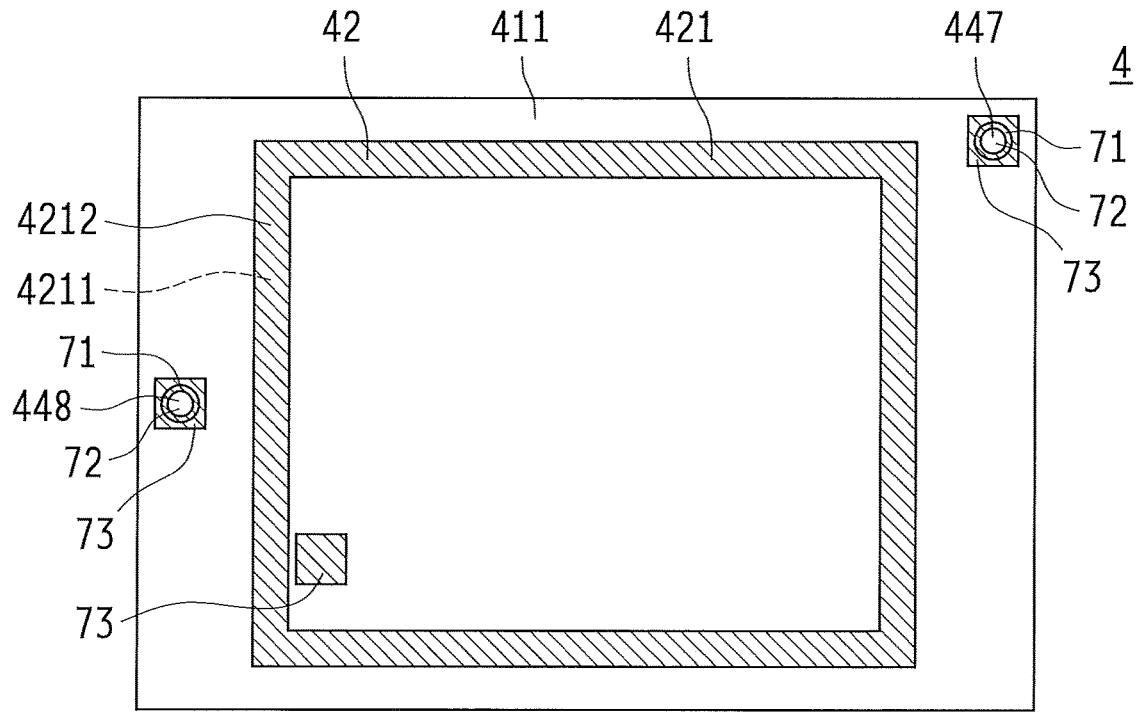
FIG. 6 is a schematic plan view illustrating a second sealing member of the crystal resonator according to the embodiment.

The second sealing member 4 is made of a material having the flexural rigidity (moment of inertia of area× Young's modulus) of not more than 1000 [N·mm²]. Specifically, as shown in FIG. 6, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern 421 is formed so as to be bonded to the crystal resonator plate 2. The sealing-member-side second bonding pattern 421 is formed so as to have an annular shape in plan view. The sealing-member-side second bonding pattern 421 has the same width at all positions on the sealing-member-side second sealing part 42 of the second sealing member 4.

The sealing-member-side second bonding pattern 421 is constituted by a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealingmember-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side.

Figure 7:
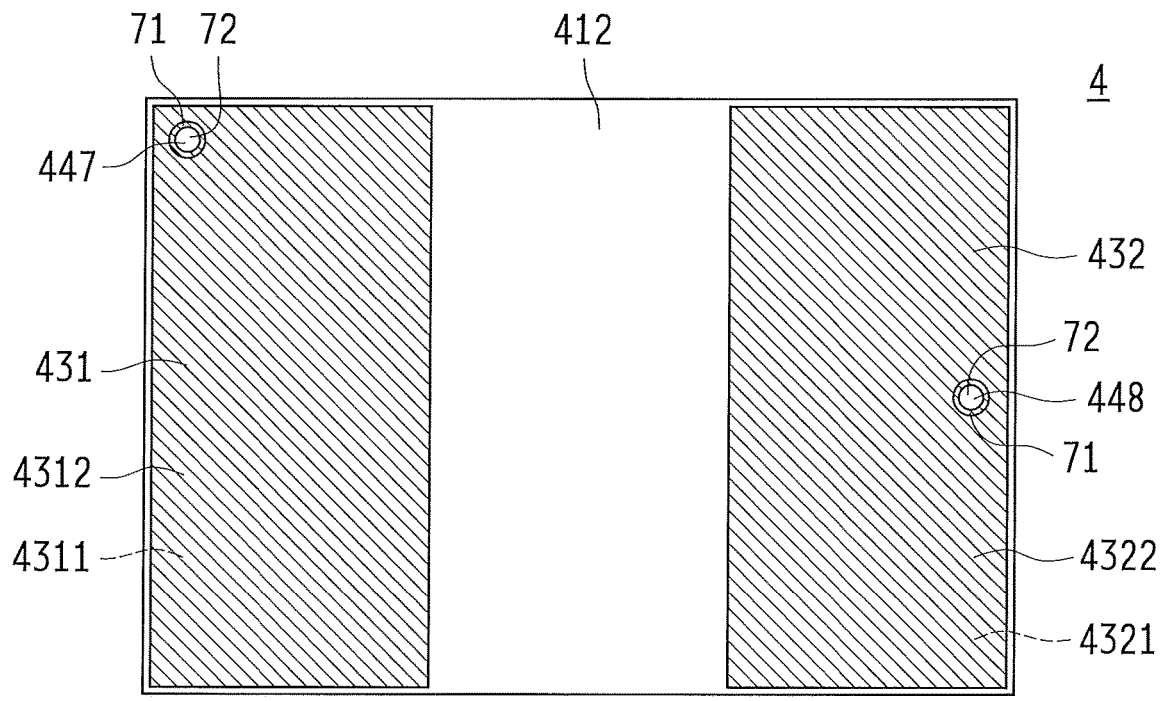
FIG. 7 is a schematic rear view illustrating the second sealing member of the crystal resonator according to the embodiment.

Also, a pair of external electrode terminals (the first external electrode terminal 431 and the second external electrode terminal 432), which is electrically connected to the outside, is formed on a second main surface 412 (the outer main surface not facing the crystal resonator plate 2) of the second sealing member 4. As shown in FIGS. 1 and 7, the first external electrode terminal 431 and the second external electrode terminal 432 are located at respective end parts of the second main surface 412 of the second sealing member 4 in the longitudinal direction in plan view. The pair of external electrode terminals (the first external electrode terminal 431 and the second external electrode terminal 432) is constituted by base PVD films 4311 and 4321 deposited on the second main surface 412 by the physical vapor deposition, and electrode PVD films 4312 and 4322 respectively deposited on the base PVD films 4311 and 4321 by the physical vapor deposition. The first external electrode terminal 431 and the second external electrode terminal 432 each cover a region of not less than ⅓ of the area of the second main surface 412 of the second sealing member 4.

As shown in FIGS. 1, 6 and 7, two through holes (the eighth through hole 447 and the ninth through hole 448) are formed in the second sealing member 4 so as to penetrate between the first main surface 411 and the second main surface 412. The eighth through hole 447 is connected to the first external electrode terminal 431 and to the first through hole 267 of the crystal resonator plate 2. The ninth through hole 448 is connected to the second external electrode terminal 432 and to the second through hole 268 of the crystal resonator plate 2. The eighth through hole 447 and the ninth through hole 448 are located at respective end parts of the second sealing member 4 in the longitudinal direction in plan view.

In each of the eighth through hole 447 and the ninth through hole 448, the through electrode 71 is formed along a corresponding inner wall surface of the eighth through hole 447 and the ninth through hole 448 so as to establish conduction between electrodes formed on the first main surface 411 and the second main surface 412, as shown in FIGS. 1, 6 and 7. Each central part of the eighth through hole 447 and the ninth through hole 448 is the hollow through part 72 penetrating between the first main surface 411 and the second main surface 412. The connection bonding pattern 73 is formed on each outer periphery of the eighth through hole 447 and the ninth through hole 448. The connection bonding pattern 73 is also formed on the first main surface 411, inside the sealing-member-side second bonding pattern 421 in plan view, so as to be bonded to the connection bonding pattern 73 formed on the outer periphery of the third through hole 269 of the crystal resonator plate 2. The connection bonding patterns 73 are formed on the first main surface 411 of the second sealing member 4. The connection bonding patterns 73 have the same configuration as the sealing-member-side second bonding pattern 421, accordingly, they can be formed by the same process as that for the sealing-member-side second bonding pattern 421. Specifically, each connection bonding pattern 73 is constituted by a base PVD film deposited on the first main surface 411 of the second sealing member 4 by the physical vapor deposition, and an electrode PVD film deposited on the base PVD film by the physical vapor deposition.

In the crystal resonator 101, the eighth through hole 447 and the ninth through hole 448 are formed outside the internal space 13 in plan view. The eighth through hole 447 and the ninth through hole 448 are not electrically connected to the sealing-member-side second bonding pattern 421. Also, the first external electrode terminal 431 and the second external electrode terminal 432 are not electrically connected to the sealing-member-side second bonding pattern 421.

In the crystal resonator 101 having the above configuration, the crystal resonator plate 2 and the first sealing member 3 are subjected to diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 1 is produced. In contrast to the conventional art, no special bonding material, such as an adhesive, is needed separately. Thus, the internal space 13 of the package 12, i.e. the space for housing the vibrating part 23 is hermetically sealed. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. The respective bonding materials 11 are formed so as to have an annular shape in plan view.

At this time, the respective connection bonding patterns 73 on the outer peripheries of the first through ninth through holes 267-269, 347-350, 447 and 448 are also subjected to the diffusion bonding in a state in which they are overlapped with each other. Specifically, the respective connection bonding patterns 73 of the first through hole 267 and the fourth through hole 347 are subjected to the diffusion bonding. The respective connection bonding patterns 73 of the first through hole 267 and the eighth through hole 447 are subjected to the diffusion bonding. The respective connection bonding patterns 73 of the second through hole 268 and the sixth through hole 349 are subjected to the diffusion bonding. The respective connection bonding patterns 73 of the second through hole 268 and the ninth through hole 448 are subjected to the diffusion bonding. The respective connection bonding patterns 73 of the third through hole 269 and the seventh through hole 350 are subjected to the diffusion bonding. The connection bonding pattern 73 of the third through hole 269 is overlapped with the connection bonding pattern 73 formed on the first main surface 411 of the second sealing member 4 so as to be subjected to the diffusion bonding. Then, the respective pairs of connection bonding patterns 73 become the bonding materials 14 formed upon the diffusion bonding. The connection bonding pattern 73 of the fifth through hole 348 is overlapped with the first extraction electrode 223 extracted from the first excitation electrode 221 of the crystal resonator plate 2 so as to be subjected to the diffusion bonding. Then, the connection bonding pattern 73 and the first extraction electrode 223 themselves become the bonding material 14 formed upon the diffusion bonding. The bonding materials 14 formed upon the diffusion bonding serve to establish conduction between the through electrodes 71 of the through holes and to hermetically seal the bonding parts. In FIG. 1, the bonding materials 14 formed outside the bonding materials 11 for sealing in plan view are shown by the solid line, while the bonding materials 14 formed inside the bonding materials 11 are shown by the broken line.

In this embodiment, the diffusion bonding is performed at a room temperature. Here, the room temperature means the temperature in the range from 5 to 35° C. Advantageous effects as described later (suppression of generation of gas and improvement of bonding) are obtained by the diffusion bonding at the room temperature, which is lower than the melting point of 183° C. of the eutectic solder. Thus, this is a preferable embodiment. However, the advantageous effects described later can be obtained by the diffusion bonding performed at temperatures other than the room temperature. That is, the diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize an unstable regions of the bonding parts. Also, in this embodiment, since the special bonding material such as Au—Sn is not used, the gas such as plating gas, binder gas or metal gas is not generated. Thus, the temperature can be equal to or more than the recrystallization temperature of Au.

In the package 12 produced by the diffusion bonding, the first sealing member 3 and the crystal resonator plate 2 have a gap of not more than 1.00 µm. The second sealing member 4 and the crystal resonator plate 2 have a gap of not more than 1.00 µm. That is, the thickness of the bonding material 11 between the first sealing member 3 and the crystal resonator plate 2 is not more than 1.00 µm, and the thickness of the bonding material 11 between the second sealing member 4 and the crystal resonator plate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

The thickness of the bonding pattern made by the diffusion bonding of the sealing-member-side first bonding pattern 321 and the resonator-plate-side first bonding pattern 251 is the same as the thickness of the bonding pattern made by the diffusion bonding of the sealing-member-side second bonding pattern 421 and the resonator-plate-side second bonding pattern 252, and is different from the thickness of the external electrode terminals (the first external electrode terminal 431 and the second external electrode terminal 432) that are electrically connected to the outside.

In this embodiment, the third through hole 269 and the seventh through hole 350 are formed in the inward position of the internal space 13 in plan view (i.e. inside of the respective inner peripheral surfaces of the bonding materials 11). And in this case, the third through hole 269 and the seventh through hole 350 are disposed so as to not be superimposed to each other in plan view. Specifically, as shown in FIG. 2, the third through hole 269 and the seventh through hole 350 are vertically linearly arranged in front view (i.e. when viewed from the direction indicated by arrow A1 in FIG. 2). For convenience sake, in FIG. 2, the third through hole 269 formed in the crystal resonator plate 2 disposed under the first sealing member 3 is shown by the dashed double-dotted line. On the other hand, the third through hole 269 and the seventh through hole 350 are offset from each other so as to not be vertically linearly arranged in side view (i.e. when viewed from the direction indicated by the arrow A2 in FIG. 2). More specifically, the third through hole 269 is connected to one end part of the bonding material 14 (the connection bonding pattern 73) in the longitudinal direction thereof (i.e. the direction indicated by the arrow A1 in FIGS. 3 and 4), and the seventh through hole 350 is connected to the other end part of the bonding material 14 in the longitudinal direction thereof. Thus, the through electrode 71 of the third through hole 269 is electrically connected to the through electrode 71 of the seventh through hole 350 via the bonding material 14.

Since the third through hole 269 and the seventh through hole 350 are arranged so as to not be superimposed to each other in plan view, it is possible to ensure the hermeticity of the internal space 13 in which the vibrating part 23 of the crystal resonator plate 2 is hermetically sealed without the necessity of filling the through part 72 of the third through hole 269 and the through part 72 of the seventh through hole 350 with a metal and the like. That is, if the respective through parts 72 of the third through hole 269 and the seventh through hole 350 (hereinafter referred to as "both through holes") are superimposed to each other in plan view, the parts that require to be sealed may increase in order to ensure the hermeticity of the internal space 13. In this case, it is necessary to seal between the crystal resonator plate 2 and the first sealing member 3, and between the crystal resonator plate 2 and the second sealing member 4. And if the respective through parts 72 of both through holes are not filled with a metal and the like, such a condition may cause poor hermeticity of the internal space 13.

On the other hand, in this embodiment, the respective through parts 72 of both through holes are arranged so as to not be superimposed to each other in plan view. Thus, even when the respective through parts 72 of both through holes are not filled with a metal and the like, it is possible to ensure the hermeticity of the internal space 13 in which the vibrating part 23 of the crystal resonator plate 2 is hermetically sealed. Therefore, it is possible for the crystal resonator 101 having the sandwich structure to improve reliability while ensuring the hermeticity of the internal space 13 in which the vibrating part 23 of the crystal resonator plate 2 is sealed. Furthermore, there is no need to undergo a process for filling the respective through parts 72 of the both through holes with a metal and the like. Thus, a filling metal is not required, which is beneficial in reducing costs. Also, the bond of the respective connection bonding patterns 73 covers the space between the crystal resonator plate 2 and the first sealing member 3, thus it is possible to improve the hermeticity of the internal space 13. Also, the bond of the respective connection bonding patterns 73 establishes conduction between the respective through electrodes 71 of both through holes, thus it is possible to ensure electrical connection between the respective through electrodes 71 of both through holes.

Since the bonding material 11 is formed so as to have an annular shape and to have an area relatively large, the bond strength of the bonding material 11 is greater than the bond strength of the bonding material 14. The bonding part of the connection bonding pattern 73 of the third through hole 269 and the connection bonding pattern 73 of the seventh through hole 350 (i.e. the bonding material 14) is formed inside the bonding material 11 in plan view. Thus, even when distortion stress or the like is applied to the crystal resonator 101, the bonding material 14 can be protected by the bonding material 11 having a large bonded area. Therefore, it is possible to improve the hermeticity of the internal space 13.

Also, in this embodiment, it is possible to suppress the variation in the height of the package 12 of the crystal resonator 101. For example, unlike the configuration of this embodiment, when using the metal paste sealing material such as a Sn-containing bonding material that makes gaps of more than 1 µm between the crystal resonator plate 2 and the respective sealing members (in this embodiment, the first sealing member 3 and the second sealing member 4), the variation in the height occurs when the metal paste sealing material is formed on the patterns (the resonator-plate-side first bonding pattern 251, the resonator-plate-side second bonding pattern 252, the sealing-member-side first bonding pattern 321 and the sealing-member-side second bonding pattern 421). Also, after bonding, due to heat capacity distribution in the formed patterns (the resonator-plate-side first bonding pattern 251, the resonator-plate-side second bonding pattern 252, the sealing-member-side first bonding pattern 321 and the sealing-member-side second bonding pattern 421), the even gaps (in this embodiment, the gap between the first sealing member 3 and the crystal resonator plate 2, and the gap between the second sealing member 4 and the crystal resonator plate 2) are not formed. Therefore, in the conventional art, when three members (i.e. the first sealing member, the second sealing member and the crystal resonator plate) are laminated, the respective gaps between the three members are different. As a result, the laminated three members are bonded in a state in which they are not parallel to one another. Especially, this problem becomes remarkable according to the reduction in the height of the package 12. However, in this embodiment, since the upper limit of the gap is set to 1.00 µm, the three members (i.e., the first sealing member 3, the second sealing member 4 and the crystal resonator plate 2) can be laminated and bonded in a state in which they are parallel to one another, thus, the configuration in this embodiment can be adaptable to the height reduction of the package 12. That is, in this embodiment, it is possible to provide the crystal resonator 101 having a thin thickness and a superior dimensional accuracy even when the height of the package 12 is reduced. Furthermore, since the variation of the inter-layer capacity of the crystal resonator 101 can be reduced, it is possible to suppress the variation in the frequency caused by the variation of the inter-layer capacity.

In this embodiment, the first excitation electrode 221 and the second excitation electrode 222 are not electrically connected to the bonding materials 11 serving as the sealing parts for hermetically sealing the vibrating part 23 of the crystal resonator plate 2. More specifically, the first excitation electrode 221 is electrically connected to the first external electrode terminal 431 via the fifth through hole 348, the first terminal 37, the fourth through hole 347, the first through hole 267 and the eighth through hole 447 in this order. Also, the second excitation electrode 222 is electrically connected to the second external electrode terminal 432 via the third through hole 269, the seventh through hole 350, the second terminal 38, the sixth through hole 349, the second through hole 268 and the ninth through hole 448 in this order. In this case, the first excitation electrode 221, the second excitation electrode 222, the first external electrode terminal 431 and the second external electrode terminal 432 are not electrically connected to the bonding materials 11 (i.e. the resonator-plate-side first bonding pattern 251 and the sealing-member-side first bonding pattern 321, and the resonator-plate-side second bonding pattern 252 and the sealing-member-side second bonding pattern 421) for hermetically sealing the vibrating part 23. That is, an electrical path (conduction path) from the first excitation electrode 221 to the first external electrode terminal 431 is provided to pass through the first terminal 37 on the first main surface 311 of the first sealing member 3 so that the electrical path is not electrically connected to the bonding materials 11. Similarly, an electrical path from the second excitation electrode 222 to the second external electrode terminal 432 is provided to pass through the second terminal 38 on the first main surface 311 of the first sealing member 3 so that the electrical path is not electrically connected to the bonding materials 11.

In other words, a first electrical path (the fourth through hole 347, the first through hole 267 and the eighth through hole 447) to conduct the first terminal 37 to the first external electrode terminal 431 and a second electrical path (the sixth through hole 349, the second through hole 268 and the ninth through hole 448) to conduct the second terminal 38 to the second external electrode terminal 432 are formed outside the bonding materials 11 in plan view. Also, a third electrical path (the fifth through hole 348) to conduct the first excitation electrode 221 to the first terminal 37 and a fourth electrical path (the third through hole 269 and the seventh through hole 350) to conduct the second excitation electrode 222 to the second terminal 38 are formed inside the bonding materials 11 in plan view. Thus, the first excitation electrode 221 is connected to the first terminal 37 via the third electrical path formed inside the bonding materials 11 in plan view, and the first terminal 37 is connected to the first external electrode terminal 431 via the first electrical path formed outside the bonding materials 11 in plan view. Also, the second excitation electrode 222 is connected to the second terminal 38 via the fourth electrical path formed inside the bonding materials 11 in plan view, and the second terminal 38 is connected to the second external electrode terminal 432 via the second electrical path formed outside the bonding materials 11 in plan view.

In this way, the first excitation electrode 221 and the second excitation electrode 222 are not electrically connected to the bonding materials 11, accordingly, the first excitation electrode 221 and the second excitation electrode 222 are electrically independent, respectively, from the bonding materials 11. Thus, it is possible to suppress the generation of the parasitic capacity (stray capacity) due to the bonding materials 11, which ensures a large frequency variation amount of the crystal resonator 101. As a result, it is possible for the crystal resonator 101 having the sandwich structure to improve reliability while ensuring, by the bonding materials 11, the hermeticity of the internal space 13 in which the vibrating part 23 of the crystal resonator plate 2 is sealed.

Figure 8:
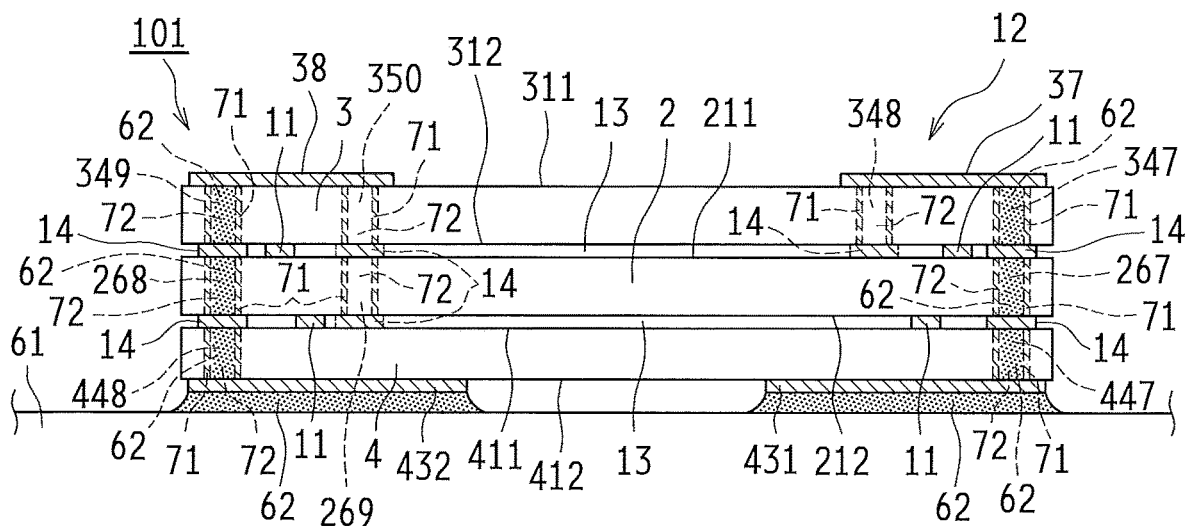
FIG. 8 is a diagram illustrating a bonding structure of the crystal resonator shown in FIG. 1 and a circuit board.
Figure 9:
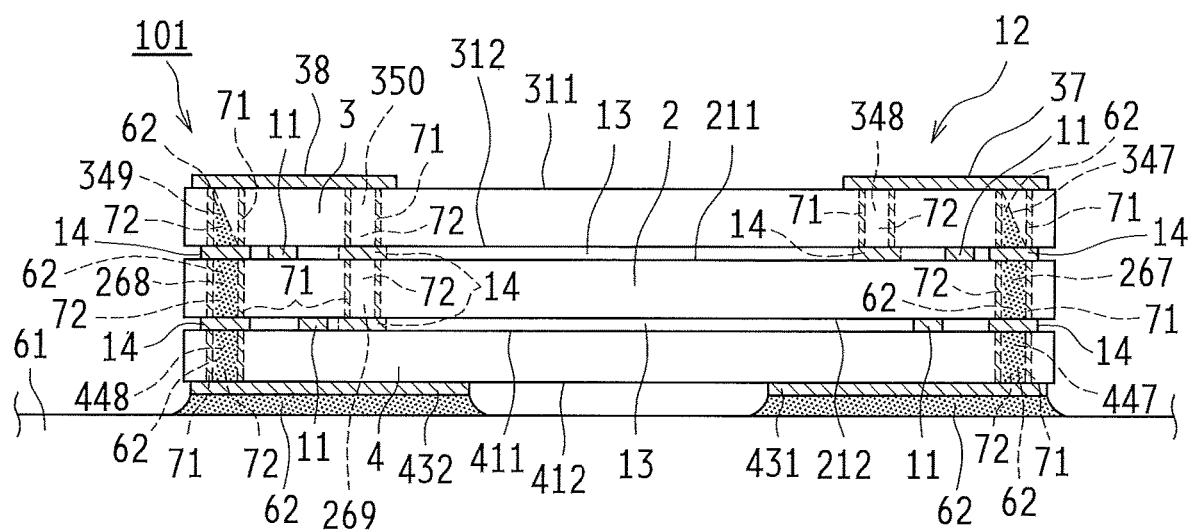
FIG. 9 is a diagram illustrating a bonding structure of the crystal resonator shown in FIG. 1 and a circuit board.

The crystal resonator 101 having the configuration as described above is electrically connected to a circuit board 61 using a flowable conductive bonding material (in this embodiment, a solder 62). Here, as shown in FIGS. 8 and 9, in the bonding structure in which the external electrode terminals (the first external electrode terminal 431 and the second external electrode terminal 432) are electrically connected to the circuit board 61, the through parts 72 of the eighth through hole 447 and the ninth through hole 448 are filled with the solder 62, thus the crystal resonator 101 is bonded to the circuit board 61. In the bonding structure shown in FIG. 8, the through parts 72 of the through holes formed outside the bonding materials 11 in plan view (i.e. the first through hole 267, the second through hole 268, the fourth through hole 347, the sixth through hole 349, the eighth through hole 447 and the ninth through hole 448) are completely filled with the solder 62. Also, in the bonding structure shown in FIG. 9, the through parts 72 of the first through hole 267, the second through hole 268, the eighth through hole 447 and the ninth through hole 448 are completely filled with the solder 62 while the through parts 72 of the fourth through hole 347 and the sixth through hole 349 are partially filled with the solder 62. Note that only the through parts 72 of the through holes formed in the lowermost layer (i.e. the eighth through hole 447 and the ninth through hole 448) may be filled with the solder 62. Alternatively, the through parts 72 of the through holes formed in the lowermost layer and the second lowermost layer (i.e. the first through hole 267, the second through hole 268, the eighth through hole 447 and the ninth through hole 448) may be filled with the solder 62.

Here, in the state in which the resonator-plate-side second bonding pattern 252 of the crystal resonator plate 2 is overlapped with the sealing-member-side second bonding pattern 421 of the second sealing member 4, the through parts 72 of the first through hole 267, the fourth through hole 347 and the eighth through hole 447 are at least partially (in this embodiment, completely) superimposed to one another. Also, the through parts 72 of the second through hole 268, the sixth through hole 349 and the ninth through hole 448 are at least partially (in this embodiment, completely) superimposed to one another. Thus, even when bubbles are included in the solder 62 used for electrically connecting the crystal resonator 101 to the circuit board 61, it is possible to remove the bubbles of the solder 62 to the outside from the first main surface 311 of the first sealing member 3 through the superimposed parts.

In addition to the above, when the external electrode terminals (the first external electrode terminal 431 and the second external electrode terminal 432) are electrically connected to the circuit board 61 using the solder 62, the solder 62 creeps up from the external electrode terminals to the through parts 72 of the eighth through hole 447 and the ninth through hole 448 along the eighth through hole 447 and the ninth through hole 448. When using a large amount of solder 62, the through parts 72 of the eighth through hole 447 and the ninth through hole 448 are filled with the solder 62 (see FIGS. 8 and 9). In this case, the hermeticity of the internal space 13 in which the vibrating part 23 of the crystal resonator plate 2 is hermetically sealed may be decreased due to corrosion of the solder 62 that creeps up the through parts 72. However, in this embodiment, the path from the first excitation electrode 221 of the crystal resonator plate 2 to the first external electrode terminal 431 is constituted by the third electrical path (the fifth through hole 348), the first terminal and the first electrical path (the fourth through hole 347, the first through hole 267 and the eighth through hole 447), thus it is possible to ensure a relatively long distance as the length of the path. Also, the path from the second excitation electrode 222 of the crystal resonator plate 2 to the second external electrode terminal 432 is constituted by the fourth electrical path (the third through hole 269 and the seventh through hole 350), the second terminal and the second electrical path (the sixth through hole 349, the second through hole 268 and the ninth through hole 448), thus it is possible to ensure a relatively long distance as the length of the path. Therefore, it is possible to prevent the internal space 13 from being affected by corrosion of the solder 62 that decreases the hermeticity.

Also, the electrical paths (the first electrical path and the second electrical path) are positioned spaced apart from the vibrating part 23 of the crystal resonator plate 2 provided inside the bonding materials 11. Thus, even when the through parts 72 of the electrical paths are filled with the solder 62 having a different coefficient of thermal expansion from that of the crystal resonator plate 2 or the like at the time of bonding the crystal resonator 101 to the external circuit board 61, it is possible to prevent the generated bonding stress from affecting the vibrating part 23 of the crystal resonator plate 2.

Specifically, when the through parts 72 of the electrical paths are filled with the solder 62 at the time of bonding the crystal resonator 101 to the external circuit board 61, the vibrating part 23 of the crystal resonator plate 2 may be affected by the stress caused by the difference in the coefficient of thermal expansion between the solder 62 and the crystal resonator plate 2 or the like. However, in this embodiment, even when the through parts 72 of the electrical paths are filled with the solder 62, the vibrating part 23 of the crystal resonator plate 2 and the through holes are disposed spaced apart from each other. Thus, it is possible to prevent the stress caused by the difference in the coefficient of thermal expansion from affecting the vibrating part 23 of the crystal resonator plate 2. Also, since the sealing parts (the bonding materials 11) for the sealed region are interposed between the vibrating part 23 of the crystal resonator plate 2 and the through parts 72 of the electrical paths, the stress caused by the difference in the coefficient of thermal expansion is not directly transmitted to the vibrating part 23 of the crystal resonator plate 2 from the solder 62 filling the through parts 72. Thus, the bonding materials 11 prevent the stress caused by the difference in the coefficient of thermal expansion from being transmitted, which results in reduction of the stress that is transmitted to the vibrating part 23 of the crystal resonator plate 2.

Also, when bonding the crystal resonator 101 to the circuit board 61 using the solder 62, the solder 62 creeps up the through parts 72 of the eighth through hole 447 and the ninth through hole 448 along the eighth through hole 447 and the ninth through hole 448 from the external electrode terminals (the first external electrode terminal 431 and the second external electrode terminal 432), thus the through parts 72 of the eighth through hole 447 and the ninth through hole 448 are filled with the solder 62. For this reason, when the crystal resonator 101 is bonded to the circuit board 61 and the bonding stress is generated, the generated bonding stress is dispersed by the amount corresponding to the solder 62 that creeps up the through parts 72 of the eighth through hole 447 and the ninth through hole 448. Therefore, when bonding, it is possible to reduce the bonding stress that is applied to the external electrode terminals.

Also, the eighth through hole 447 and the ninth through hole 448 are positioned spaced apart from the vibrating part 23 provided in the sealed region of the internal space 13. Thus, even when the through parts 72 of the eighth through hole 447 and the ninth through hole 448 are filled with the solder 62 having the different coefficient of thermal expansion from that of the crystal resonator plate 2 or the like at the time of bonding the crystal resonator 101 to the external circuit board 61, it is possible to prevent the generated bonding stress from affecting the vibrating part 23 of the crystal resonator plate 2.

Specifically, when the through parts 72 of the eighth through hole 447 and the ninth through hole 448 are filled with the solder 62 at the time of bonding the crystal resonator 101 to the external circuit board 61, the vibrating part 23 of the crystal resonator plate 2 may be affected by the stress caused by the difference in the coefficient of thermal expansion between the solder 62 and the crystal resonator plate 2 or the like. However, in this embodiment, even when the through parts 72 of the eighth through hole 447 and the ninth through hole 448 are filled with the solder 62, it is possible to prevent the stress caused by the difference in the coefficient of thermal expansion from affecting the vibrating part 23 of the crystal resonator plate 2, because the vibrating part 23 of the crystal resonator plate 2, the eighth through hole 447 and the ninth through hole 448 are positioned spaced apart from each other in plan view. Also, since the sealing parts for the sealed region (i.e. the region sealed by the bonding materials 11) are interposed between the vibrating part 23 of the crystal resonator plate 2, and the eighth through hole 447 and the ninth through hole 448, the stress caused by the difference in the coefficient of thermal expansion is not directly transmitted to the vibrating part 23 of the crystal resonator plate 2 from the solder 62 filling the eighth through hole 447 and the ninth through hole 448. Thus, the sealing parts for the sealed region (i.e. the region sealed by the bonding materials 11) prevent the stress caused by the difference in the coefficient of thermal expansion from being transmitted, which results in reduction of the stress that is transmitted to the vibrating part 23 of the crystal resonator plate 2.

Also, since the first terminal 37 and the second terminal 38 are disposed on the first main surface 311 (i.e., the external surface not facing the crystal resonator plate 2) of the first sealing member 3, it is possible to easily test the crystal resonator plate 2 before bonding it to the second sealing member 4, using the first terminal 37 and the second terminal 38 as test terminals for the crystal resonator plate 2. Specifically, it is possible to easily test the crystal resonator plate 2 not only before the crystal resonator 101 is mounted on the circuit board 61 but also after the crystal resonator 101 is mounted on the circuit board 61. Not being limited thereto, it is possible to easily test the crystal resonator plate 2 even in the state in which the crystal resonator plate 2 and the first sealing member 3 are bonded to each other (in the state in which the second sealing member 4 is not bonded). Furthermore, the size and the shape of the first terminal 37 and the second terminal 38 can be easily changed. Thus, the capacity of the crystal resonator plate 2 viewed from the external electrode terminals (the first external electrode terminal 431 and the second external electrode terminal 432) can be finely adjusted as required.

In this case, it is preferable to form the above-described test terminals on outer side parts 37a and 38a of the first terminal 37 and the second terminal 38, which are positioned outside the internal space 13 in plan view. Since an inspection probe makes contact with the test terminal, the pressure when the probe makes contact with the test terminal is applied to the first sealing member 3. Here, if the test terminals are provided inside the internal space 13 in plan view, the pressure when the probe makes contact with the test terminal may deform (bend) the first sealing member 3. Such a deformation of the first sealing member 3 may decrease the distance between the first sealing member 3 and the vibrating part 23 (the first excitation electrode 221) of the crystal resonator plate 2 or may cause the first sealing member 3 and the vibrating part 23 (the first excitation electrode 221) of the crystal resonator plate 2 to make contact with each other. For this reason, the piezoelectric vibration of the vibrating part 23 of the crystal resonator plate 2 may be prevented or the stray capacity may change. However, by forming the test terminals on the outer side parts 37a and 38a of the first terminal 37 and the second terminal 38, it is possible to distribute, from the first sealing member 3 to the piezoelectric resonator plate 2, the pressure when the probe makes contact with the test terminal, which leads to suppression of the deformation of the first sealing member 3. In this way, it is possible to prevent the block of the piezoelectric vibration of the vibrating part 23 of the crystal resonator plate 2 or to suppress the change in the stray capacity, both of which are caused by the deformation of the first sealing member 3.

In this embodiment, the first sealing member 3 and the second sealing member 4 are made of glass, however, the present invention is not limited thereto. They may be made of crystal.

Also, in this embodiment, the piezoelectric resonator plate is made of crystal, however, the present invention is not limited thereto. It may be made of another material such as lithium niobate and lithium tantalate, i.e., a piezoelectric material.

Also, in this embodiment, the bonding materials 11 are made of Ti (or Cr) and Au, however, the present invention is not limited thereto. The bonding materials 11 may be made, for example, of Ni and Au.

In this embodiment, the through parts 72 of the first through hole 267, the fourth through hole 347 and the eighth through hole 447 are at least partially superimposed to one another. However, the through part 72 of the first through hole 267 is not necessarily superimposed, respectively, to the through part 72 of the fourth through hole 347 and the through part 72 of the eighth through hole 447 in plan view. Similarly, the through part 72 of the second through hole 268 is not necessarily superimposed, respectively, to the through part 72 of the sixth through hole 349 and the through part 72 of the ninth through hole 448 in plan view. In this case, it is possible to ensure a further long distance as the length of the path from the first excitation electrode 221 of the crystal resonator plate 2 to the first external electrode terminal 431, or as the length of the path from the second excitation electrode 222 of the crystal resonator plate 2 to the second external electrode terminal 432. As a result, it is possible to further effectively prevent the internal space 13 from being affected by corrosion of the solder 62 that decreases the hermeticity.

Crystal Oscillator

In the above embodiment, the crystal resonator is used for the piezoelectric resonator device. However, the present invention is not limited thereto. A crystal oscillator may be used for the piezoelectric resonator device. Hereinafter, an embodiment will be described, in which the present invention is applied to a crystal oscillator as the piezoelectric resonator device that causes piezoelectric vibration. For convenience sake, the common configuration with the above-described crystal resonator 101 (see FIGS. 1 to 9) is indicated by the same reference numerals, and the description thereof is omitted. Also, since functions and effects obtained by the common configuration are similar to those of the crystal resonator 101 as described above, the description thereof is omitted. Thus, a description will be given mainly on the configuration of the crystal oscillator according to an embodiment, which differs from the configuration of the above-described crystal resonator 101.

Figure 10:
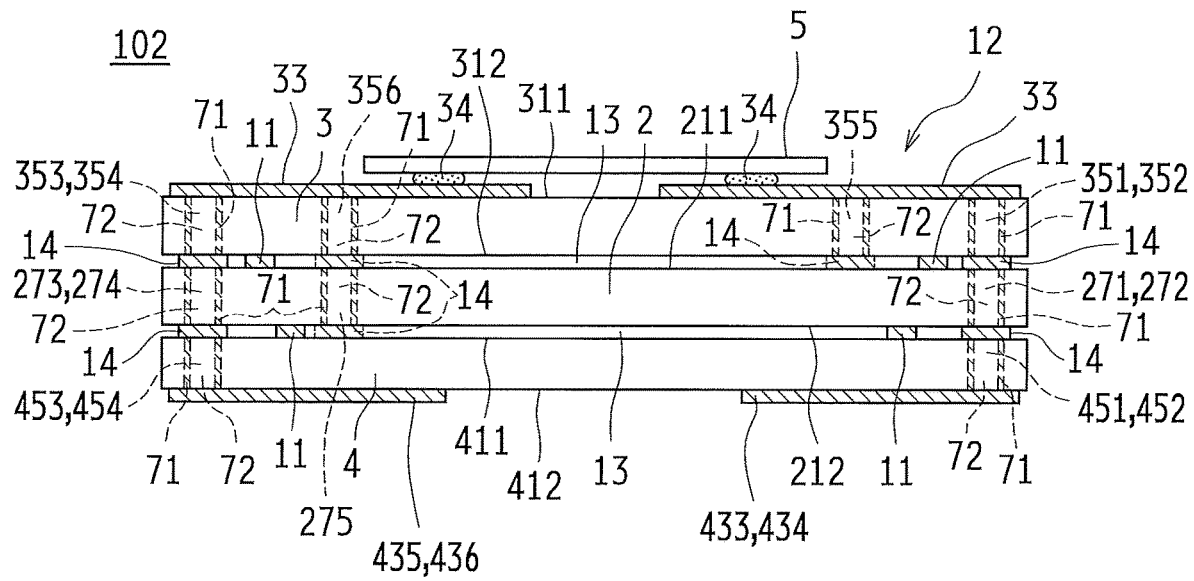
FIG. 10 is a schematic configuration diagram illustrating a configuration of a crystal oscillator according to an embodiment.

As shown in FIG. 10, a crystal oscillator 102 according to this embodiment includes: the crystal resonator plate 2 (a piezoelectric resonator plate in the present invention); the first sealing member 3 that covers the first excitation electrode 221 (see FIG. 13) of the crystal resonator plate 2 so as to hermetically seal the first excitation electrode 221 that is formed on the first main surface 211 of the crystal resonator plate 2; the second sealing member 4 disposed on the second main surface 212 of the crystal resonator plate 2 so as to cover the second excitation electrode 222 (see FIG. 14) of the crystal resonator plate 2, the second sealing member 4 for hermetically sealing the second excitation electrode 222 that makes a pair with the first excitation electrode 221; and an electronic component element (an IC 5 in this embodiment), which is other than the piezoelectric resonator element, mounted on the first sealing member. In the crystal oscillator 102, the crystal resonator plate 2 is bonded to the first sealing member 3, and also the crystal resonator plate 2 is bonded to the second sealing member 4. Thus, the package 12 having a sandwich structure is constituted.

The internal space 13 of the package 12 is formed by bonding the first sealing member 3 to the second sealing member 4 via the crystal resonator plate 2. In this internal space 13 of the package 12, the vibrating part 23 is hermetically sealed. The vibrating part 23 includes the first excitation electrode 221 and the second excitation electrode 222 respectively formed on the main surfaces 211 and 212 of the crystal resonator plate 2. The crystal oscillator 102 according to this embodiment has, for example, a package size of 1.2×1.0 mm, which is reduced in size and height. According to the size reduction, no castellation is formed in the package 12. Through holes (eleventh through twenty-fifth through holes) are used for conduction between electrodes.

Figure 14:
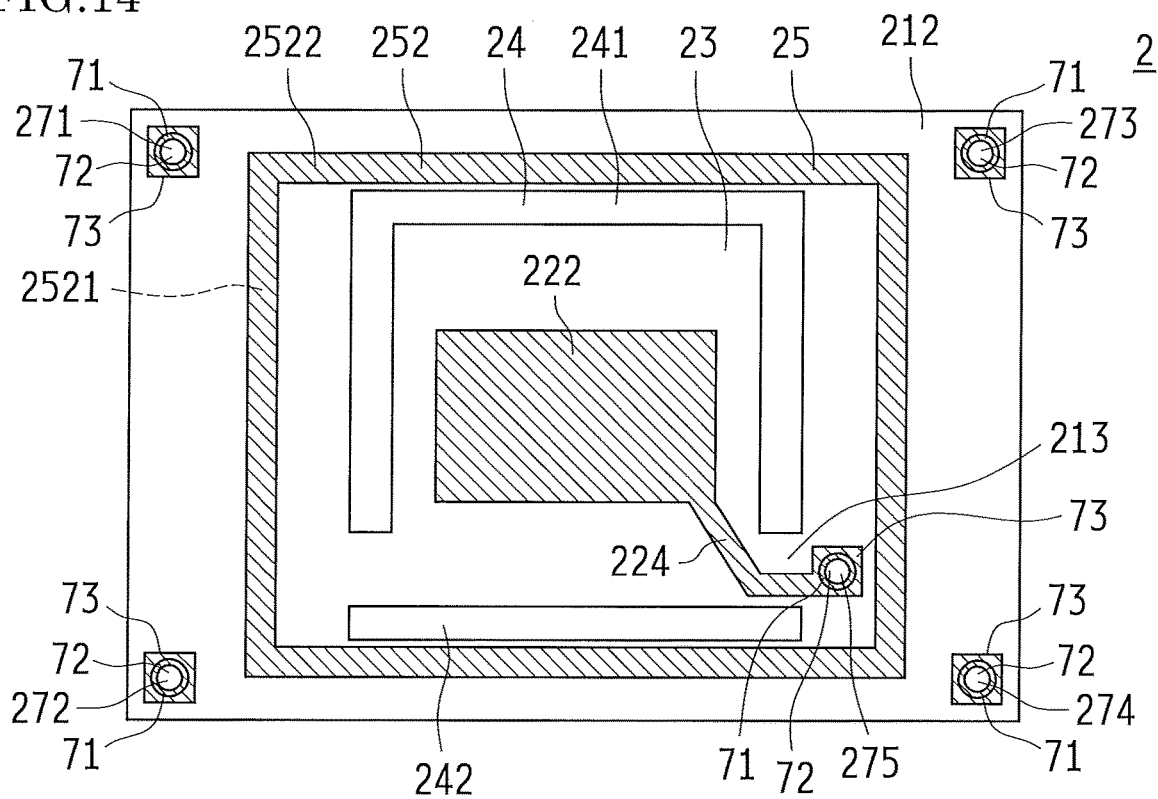
FIG. 14 is a schematic rear view illustrating the crystal resonator plate of the crystal oscillator according to the embodiment.

As shown in FIGS. 13 and 14, five through holes (the eleventh through fifteenth through holes 271 through 275) are formed in the crystal resonator plate 2 so as to penetrate between the first main surface 211 and the second main surface 212. The eleventh through hole 271 is connected to the sixteenth through hole 351 of the first sealing member 3 and to the twenty-second through hole 451 of the second sealing member 4. The twelfth through hole 272 is connected to the seventeenth through hole 352 of the first sealing member 3 and to the twenty-third through hole 452 of the second sealing member 4. The thirteenth through hole 273 is connected to the eighteenth through hole 353 of the first sealing member 3 and to the twenty-fourth through hole 453 of the second sealing member 4. The fourteenth through hole 274 is connected to the nineteenth through hole 354 of the first sealing member 3 and to the twenty-fifth through hole 454 of the second sealing member 4. The fifteenth through hole 275 is connected to the second extraction electrode 224 extracted from the second excitation electrode 222 and to the twenty-first through hole 356 of the first sealing member 3 via the bonding material 14.

In each of the eleventh through fifteenth through holes 271 through 275, the through electrode 71 is formed along a corresponding inner wall surface of the eleventh through fifteenth through holes 271 through 275 so as to establish conduction between electrodes formed on the first main surface 211 and the second main surface 212, as shown in FIGS. 10, 13 and 14. Each central part of the eleventh through fifteenth through holes 271 through 275 is the hollow through part 72 penetrating between the first main surface 211 and the second main surface 212. The connection bonding pattern 73 is formed on each outer periphery of the eleventh through fifteenth through holes 271 through 275. The respective connection bonding patterns 73 are formed on both main surfaces (the first main surface 211 and the second main surface 212) of the crystal resonator plate 2. The connection bonding patterns 73 have the same configuration as the resonator-plate-side first bonding pattern 251 and the resonator-plate-side second bonding pattern 252. That is, each connection bonding pattern 73 is constituted by a base PVD film deposited on each main surface (the first main surface 211 and the second main surface 212) of the crystal resonator plate 2 by the physical vapor deposition, and an electrode PVD film deposited on the base PVD film by the physical vapor deposition. The connection bonding pattern 73 of the fifteenth through hole 275 formed on the first main surface 211 of the crystal resonator plate 2 extends along the direction indicated by the arrow A1 in FIG. 13, and is formed between the resonator-plate-side first bonding pattern 251 and the cut-out part 24. The connection bonding pattern 73 of the fifteen through hole 275 formed on the second main surface 212 of the crystal resonator plate 2 is integrally formed with the second extraction electrode 224 that is extracted from the second excitation electrode 222. Also, the connection bonding pattern 73 extending along the direction indicated by the arrow A1 in FIG. 13 is integrally formed with the first extraction electrode 223 that is extracted from the first excitation electrode 221. This connection bonding pattern 73 is formed between the resonator-plate-side first bonding pattern 251 and the cut-out part 24.

In the crystal oscillator 102, the eleventh through fourteenth through holes 271 through 274 are formed in the outward position of the internal space 13 (outside of the respective outer peripheral surfaces of the bonding materials 11) in plan view. In contrast, the fifteenth through hole 275 is formed in the inward position of the internal space 13 (inside of the respective inner peripheral surfaces of the bonding materials 11) in plan view. The eleventh through fifteenth through holes 271 through 275 are electrically connected to neither the resonator-plate-side first bonding pattern 251 nor the resonator-plate-side second bonding pattern 252.

Figure 11:
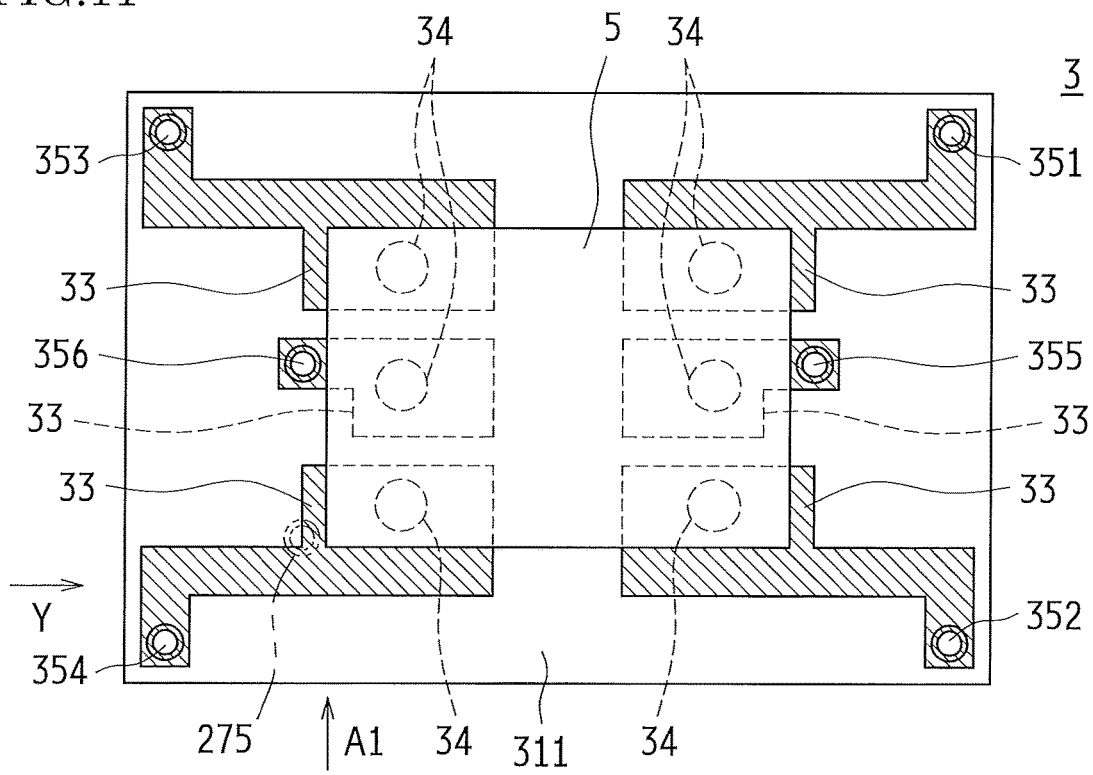
FIG. 11 is a schematic plan view illustrating a first sealing member of the crystal oscillator according to the embodiment.

A shown in FIGS. 10 and 11, on the first main surface 311 (the surface on which the IC 5 is mounted) of the first sealing member 3, six electrode patterns 33 are formed, which include mounting pads for mounting the IC 5 as an oscillation circuit element. These six electrode patterns 33 are connected, respectively, to the sixteenth through twenty-first through holes 351 through 356. The IC 5 is bonded to the electrode patterns 33 by the flip chip bonding (FCB) method using a metal bump (for example, Au bump) 34.

As shown in FIGS. 10 to 12, six through holes (the sixteenth through twenty-first through holes 351 through 356) are formed in the first sealing member 3 so as to penetrate between the first main surface 311 and the second main surface 312. The sixteenth through hole 351 is connected to the eleventh through hole 271 of the crystal resonator plate 2. The seventeenth through hole 352 is connected to the twelfth through hole 272 of the crystal resonator plate 2. The eighteenth through hole 353 is connected to the thirteenth through hole 273 of the crystal resonator plate 2. The nineteenth through hole 354 is connected to the fourteenth through hole 274 of the crystal resonator plate 2. The twentieth through hole 355 is connected to the first extraction electrode 223 extracted from the first excitation electrode 221 of the crystal resonator plate 2 via the bonding material 14. The twenty-first through hole 356 is connected to the fifteenth through hole 275 of the crystal resonator plate 2 via the bonding material 14.

In each of the sixteenth through twenty-first through holes 351 through 356, the through electrode 71 is formed along a corresponding inner wall surface of the sixteenth through twenty-first through holes 351 through 356 so as to establish conduction between electrodes formed on the first main surface 311 and the second main surface 312, as shown in FIGS. 10 to 12. Each central part of the sixteenth through twenty-first through holes 351 through 356 is the hollow through part 72 penetrating between the first main surface 311 and the second main surface 312. The connection bonding pattern 73 is formed on each outer periphery of the sixteenth through twenty-first through holes 351 through 356. The respective connection bonding patterns 73 are formed on the second main surface 312 of the first sealing member 3. The connection bonding patterns 73 have the same configuration as the sealing-member-side first bonding pattern 321. That is, the connection bonding pattern 73 is constituted by a base PVD film deposited on the second main surface 312 of the first sealing member 3 by the physical vapor deposition, and an electrode PVD film deposited on the base PVD film by the physical vapor deposition. The respective connection bonding patterns 73 of the twentieth through hole 355 and the twenty-first through hole 356 extend along the direction indicated by the arrow A1 in FIG. 12.

In the crystal oscillator 102, the sixteenth through nineteenth through holes 351 through 354 are formed in the outward position of the internal space 13 (outside of the respective outer peripheral surfaces of the bonding materials 11) in plan view. In contrast, the twentieth through hole 355 and the twenty-first through hole 356 are formed in the inward position of the internal space 13 (inside of the respective inner peripheral surfaces of the bonding materials 11) in plan view. The sixteenth through twenty-first through holes 351 through 356 are not electrically connected to the sealing-member-side first bonding pattern 321. Also, the six electrode patterns 33 are not electrically connected to the sealing-member-side first bonding pattern 321.

Four external electrode terminals (first through fourth external electrode terminals 433 through 436), which are electrically connected to the outside, are formed on a second main surface 412 (the outer main surface not facing the crystal resonator plate 2) of the second sealing member 4. The first through fourth external electrode terminals 433 through 436 are located at respective corner parts thereof. These external electrode terminals (the first through fourth external electrode terminals 433 through 436) are respectively constituted by base PVD films 4331 to 4361 deposited on the second main surface 412 by the physical vapor deposition, and electrode PVD films 4332 to 4362 respectively deposited on the base PVD films 4331 to 4361 by the physical vapor deposition.

Figure 15:
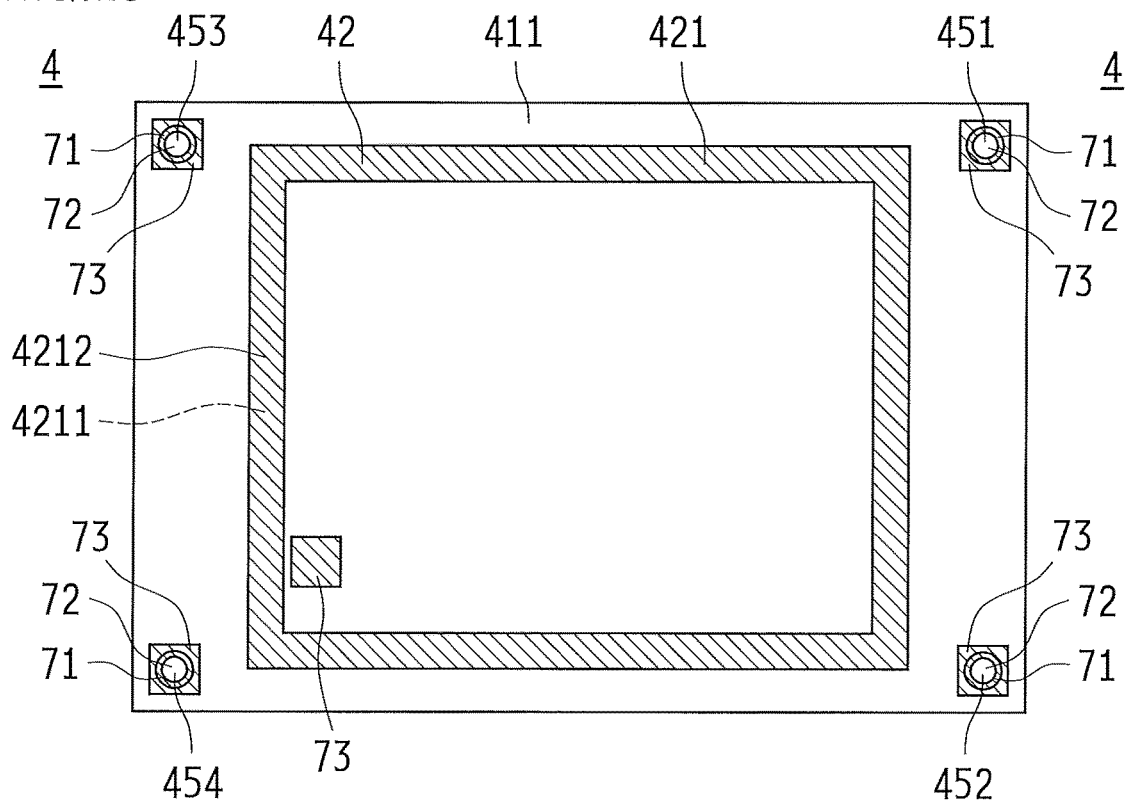
FIG. 15 is a schematic plan view illustrating a second sealing member of the crystal oscillator according to the embodiment.
Figure 16:
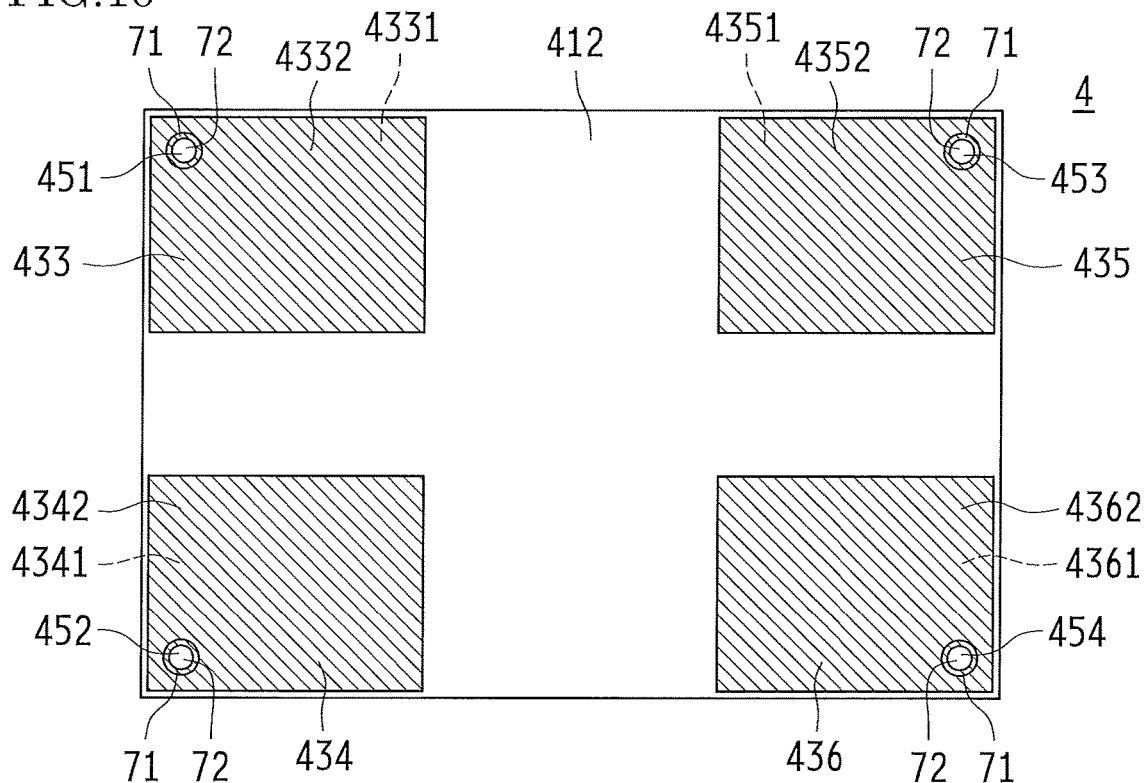
FIG. 16 is a schematic rear view illustrating the second sealing member of the crystal oscillator according to the embodiment.

As shown in FIGS. 10, 15 and 16, four through holes (the twenty-second through twenty-fifth through holes 451 through 454) are formed in the second sealing member 4 so as to penetrate between the first main surface 411 and the second main surface 412. The twenty-second through hole 451 is connected to the first external electrode terminal 433 and to the eleventh through hole 271 of the crystal resonator plate 2. The twenty-third through hole 452 is connected to the second external electrode terminal 434 and to the twelfth through hole 272 of the crystal resonator plate 2. The twenty-fourth through hole 453 is connected to the third external electrode terminal 435 and to the thirteenth through hole 273 of the crystal resonator plate 2. The twenty-fifth through hole 454 is connected to the fourth external electrode terminal 436 and to the fourteenth through hole 274 of the crystal resonator plate 2.

In each of the twenty-second through twenty-fifth through holes 451 through 454, the through electrode 71 is formed along a corresponding inner wall surface of the twenty-second through twenty-fifth through holes 451 through 454 so as to establish conduction between electrodes formed on the first main surface 411 and the second main surface 412, as shown in FIGS. 10, 15 and 16. Each central part of the twenty-second through twenty-fifth through holes 451 through 454 is the hollow through part 72 penetrating between the first main surface 411 and the second main surface 412. The connection bonding pattern 73 is formed on each outer periphery of the twenty-second through twenty-fifth through holes 451 through 454. The connection bonding patterns 73 are formed on the first main surface 411 of the second sealing member 4. The connection bonding patterns 73 have the same configuration as the sealing-member-side second bonding pattern 421, and are each constituted by a base PVD film deposited on the first main surface 411 of the second sealing member 4 by the physical vapor deposition, and an electrode PVD film deposited on the base PVD film by the physical vapor deposition.

In the crystal oscillator 102, the twenty-second through twenty-fifth through holes 451 through 454 are formed in the outward position of the internal space 13 (outside of the respective outer peripheral surfaces of the bonding materials 11) in plan view. The twenty-second through twenty-fifth through holes 451 through 454 are not electrically connected to the sealing-member-side second bonding pattern 421. Also, the first through fourth external electrode terminals 433 through 436 are not electrically connected to the sealing-member-side second bonding pattern 421.

In the crystal oscillator 102 having the above configuration, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 10 is produced. In contrast to the conventional art, no special bonding material, such as an adhesive, is needed separately. Thus, the internal space 13 of the package 12, i.e. the space for housing the vibrating part 23 is hermetically sealed. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. The respective bonding materials 11 are formed so as to have an annular shape in plan view.

At this time, the respective connection bonding patterns 73 on the outer peripheries of the eleventh through twenty-fifth through holes are also subjected to the diffusion bonding in a state in which they are overlapped with each other. Specifically, the respective connection bonding patterns 73 of the eleventh through hole 271 and the sixteenth through hole 351 are subjected to the diffusion bonding. The respective connection bonding patterns 73 of the eleventh through hole 271 and the twenty-second through hole 451 are subjected to the diffusion bonding. The respective connection bonding patterns 73 of the twelfth through hole 272 and the seventeenth through hole 352 are subjected to the diffusion bonding. The respective connection bonding patterns 73 of the twelfth through hole 272 and the twenty-third through hole 452 are subjected to the diffusion bonding. The respective connection bonding patterns 73 of the thirteenth through hole 273 and the eighteenth through hole 353 are subjected to the diffusion bonding. The respective connection bonding patterns 73 of the thirteenth through hole 273 and the twenty-fourth through hole 453 are subjected to the diffusion bonding. The respective connection bonding patterns 73 of the fourteenth through hole 274 and the nineteenth through hole 354 are subjected to the diffusion bonding. The respective connection bonding patterns 73 of the fourteenth through hole 274 and the twenty-fifth through hole 454 are subjected to the diffusion bonding.

The respective connection bonding patterns 73 of the fifteenth through hole 275 and the twenty-first through hole 356 are subjected to the diffusion bonding. The connection bonding pattern 73 of the fifteenth through hole 275 is overlapped with the connection bonding pattern 73 formed on the first main surface 411 of the second sealing member 4 so as to be subjected to the diffusion bonding. The connection bonding pattern 73 of the twentieth through hole 355 is overlapped with the connection bonding pattern 73 extending from the first extraction electrode 223 extracted from the first excitation electrode 221 of the crystal resonator plate 2 so as to be subjected to the diffusion bonding. Then, the respective connection bonding patterns 73 themselves become the bonding materials 14 formed upon the diffusion bonding. The bonding materials 14 formed upon the diffusion bonding serve to establish conduction between the through electrodes 71 of the through holes and to hermetically seal the bonding parts. In FIG. 10, the bonding materials 14 formed outside the bonding material 11 for sealing in plan view are shown by the solid line, while the bonding materials 14 formed inside the bonding materials 11 are shown by the broken line.

Thus, the twentieth through hole 355 serves as an electrical path (conduction path) to conduct the IC 5 to the first excitation electrode 221. The fifteenth through hole 275 and the twenty-first through hole 356 serve as an electrical path to conduct the IC 5 to the second excitation electrode 222. Also, the eleventh through hole 271, the sixteenth through hole 351 and the twenty-second through hole 451 serve as an electrical path to conduct the IC 5 to the first external electrode terminal 433. The twelfth through hole 272, the seventeenth through hole 352 and the twenty-third through hole 452 serve as an electrical path to conduct the IC 5 to the second external electrode terminal 434. The thirteenth through hole 273, the eighteenth through hole 353 and the twenty-fourth through hole 453 serve as an electrical path to conduct the IC 5 to the third external electrode terminal 435. The fourteenth through hole 274, the nineteenth through hole 354 and the twenty-fifth through hole 454 serve as an electrical path to conduct the IC 5 to the fourth external electrode terminal 436.

In this embodiment, the fifteenth through hole 275 and the twenty-first through hole 356 are formed in the inward position of the internal space 13 in plan view (i.e. inside of the respective inner peripheral surfaces of the bonding materials 11). And in this case, the fifteenth through hole 275 and the twenty-first through hole 356 are disposed so as to not be superimposed to each other in plan view. Specifically, as shown in FIGS. 10 and 11, the fifteenth through hole 275 and the twenty-first through hole 356 are vertically linearly arranged in front view (i.e. when viewed from the direction indicated by the arrow A1 in FIG. 11). For convenience sake, in FIG. 11, the fifteenth through hole 275 formed in the crystal resonator plate 2 disposed under the first sealing member 3 is shown by the dashed double-dotted line. On the other hand, the fifteenth through hole 275 and the twenty-first through hole 356 are offset from each other so as to not be vertically linearly arranged in side view (i.e. when viewed from the direction indicated by the arrow A2 in FIG. 11). More specifically, the fifteenth through hole 275 is connected to one end part of the bonding material 14 (the connection bonding pattern 73) in the longitudinal direction (i.e. the direction indicated by the arrow A1 in FIGS. 12 and 13), and the twenty-first through hole 356 is connected to the other end part of the bonding material 14 in the longitudinal direction. Thus, the through electrode 71 of the fifteenth through hole 275 is electrically connected to the through electrode 71 of the twenty-first through hole 356 via the bonding material 14.

In this embodiment, the first excitation electrode 221 and the second excitation electrode 222 are not electrically connected to the bonding materials 11 serving as the sealing parts for hermetically sealing the vibrating part 23 of the crystal resonator plate 2. More specifically, the first excitation electrode 221 is electrically connected to the IC 5 via the twentieth through hole 355 and the electrode pattern 33 in this order. Also, the IC 5 is electrically connected to the first external electrode terminal 433 via the electrode pattern 33, the sixteenth through hole 351, the eleventh through hole 271 and the twenty-second through hole 451 in this order. Similarly, the second excitation electrode 222 is electrically connected to the IC 5 via the fifteenth through hole 275, the twenty-first through hole 356 and the electrode pattern 33 in this order. Also, the IC 5 is electrically connected to the second external electrode terminal 434 via the electrode pattern 33, the seventeenth through hole 352, the twelfth through hole 272 and the twenty-third through hole 452 in this order. In this case, the first excitation electrode 221, the second excitation electrode 222, the first external electrode terminal 433 and the second external electrode terminal 434 are not electrically connected to the bonding materials 11 (i.e. the resonator-plate-side first bonding pattern 251 and the sealing-member-side first bonding pattern 321, and the resonator-plate-side second bonding pattern 252 and the sealing-member-side second bonding pattern 421) for hermetically sealing the vibrating part 23.

In other words, a first electrical path (the sixteenth through hole 351, the eleventh through hole 271 and the twenty-second through hole 451) to conduct the electrode pattern 33 connected to the IC 5 to the first external electrode terminal 433 and a second electrical path (the seventeenth through hole 352, the twelfth through hole 272 and the twenty-third through hole 452) to conduct the electrode pattern 33 connected to the IC 5 to the second external electrode terminal 434 are formed outside the bonding materials 11 in plan view. Also, a third electrical path (the twentieth through hole 355) to conduct the first excitation electrode 221 to the electrode pattern 33 connected to the IC 5 and a fourth electrical path (the fifteenth through hole 275 and the twenty-first through hole 356) to conduct the second excitation electrode 222 to the electrode pattern 33 connected to the IC 5 are formed inside the bonding materials 11 in plan view. Thus, the first excitation electrode 221 is connected to the electrode pattern 33 connected to the IC 5 via the third electrical path formed inside the bonding materials 11 in plan view, and the electrode pattern 33 connected to the IC 5 is connected to the first external electrode terminal 433 via the first electrical path formed outside the bonding materials 11 in plan view. Also, the second excitation electrode 222 connected to the IC 5 is connected to the electrode pattern 33 connected to the IC 5 via the fourth electrical path formed inside the bonding materials 11 in plan view, and the electrode pattern 33 connected to the IC 5 is connected to the second external electrode terminal 434 via the second electrical path formed outside the bonding materials 11 in plan view.

Figure 17:
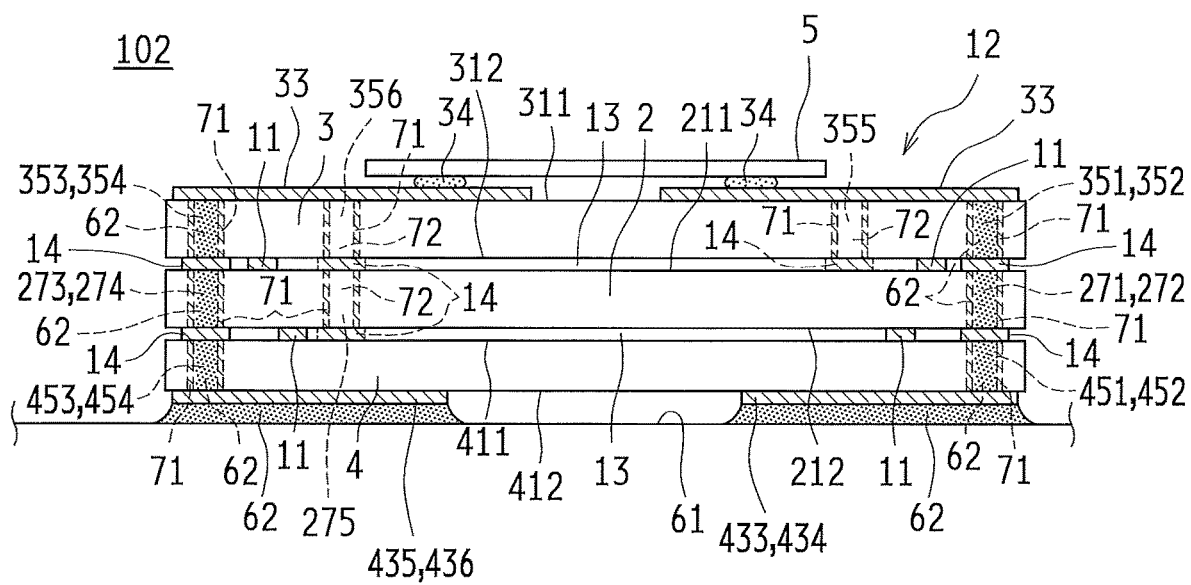
FIG. 17 is a diagram illustrating a bonding structure of the crystal oscillator shown in FIG. 10 and a circuit board.
Figure 18:
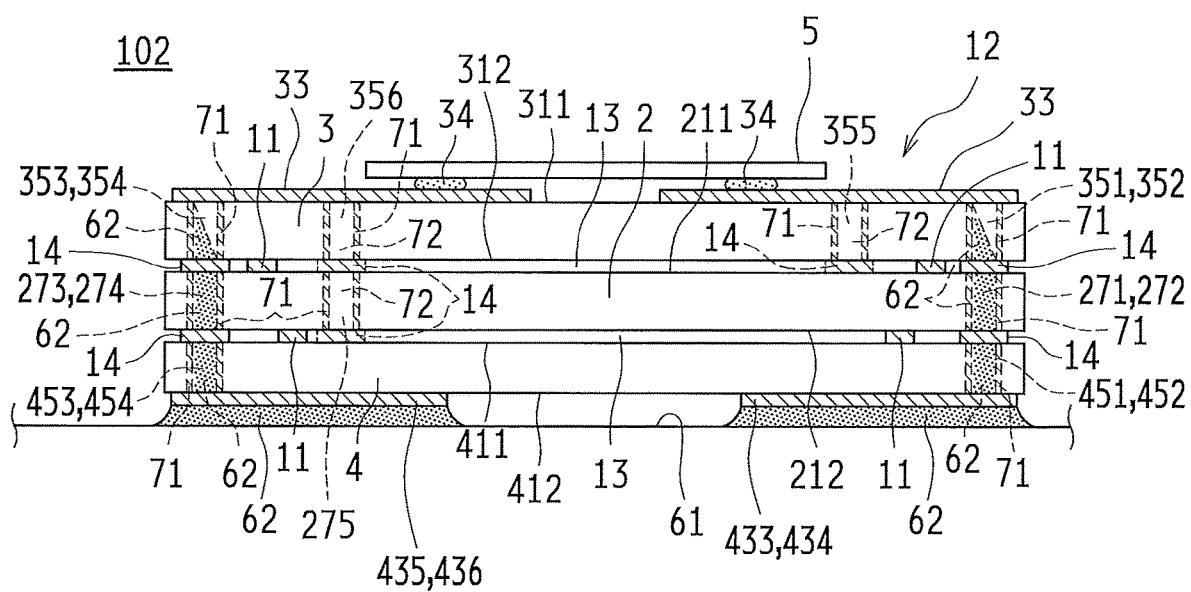
FIG. 18 is a diagram illustrating a bonding structure of the crystal oscillator shown in FIG. 10 and a circuit board.

The crystal oscillator 102 having the configuration as described above is electrically connected to the circuit board 61 using a flowable conductive bonding material (in this embodiment, the solder 62). Here, as shown in FIGS. 17 and 18, in the bonding structure in which the external electrode terminals (the first through fourth external electrode terminals 433 through 436) are electrically connected to the circuit board 61, the through parts 72 of the twenty-second through twenty-fifth through holes 451 through 454 are filled with the solder 62, thus the crystal oscillator 102 is bonded to the circuit board 61. In the bonding structure shown in FIG. 17, the through parts 72 of the through holes formed outside the bonding materials 11 in plan view (i.e. the eleventh through fourteenth through holes 271 through 274, the sixteenth through nineteenth through holes 351 through 354, and the twenty-second through twenty-fifth through holes 451 through 454) are completely filled with the solder 62. Also, in the bonding structure shown in FIG. 18, the through parts 72 of the eleventh through fourteenth through holes 271 through 274 and the twenty-second through twenty-fifth through holes 451 through 454 are completely filled with the solder 62 while the through parts 72 of the sixteenth through nineteenth through holes 351 through 354 are partially filled with the solder 62. Note that only the through parts 72 of the twenty-second through twenty-fifth through holes 451 through 454 may be filled with the solder 62.

Here, in the state in which the resonator-plate-side second bonding pattern 252 of the crystal resonator plate 2 is overlapped with the sealing-member-side second bonding pattern 421 of the second sealing member 4, the through parts 72 of the eleventh through hole 271, the sixteenth through hole 351 and the twenty-second through hole 451 are at least partially (in this embodiment, completely) superimposed to one another. Also, the through parts 72 of the twelfth through hole 272, the seventeenth through hole 352 and the twenty-third through hole 452 are at least partially (in this embodiment, completely) superimposed to one another. The through parts 72 of the thirteenth through hole 273, the eighteenth through hole 353 and the twenty-fourth through hole 453 are at least partially (in this embodiment, completely) superimposed to one another. The through parts 72 of the fourteenth through hole 274, the nineteenth through hole 354 and the twenty-fifth through hole 454 are at least partially (in this embodiment, completely) superimposed to one another.

The through part 72 of the eleventh through hole 271 is not necessarily superimposed, respectively, to the through part 72 of the sixteenth through hole 351 and the through part 72 of the twenty-second through hole 451 in plan view. Similarly, the through part 72 of twelfth through hole 272 is not necessarily superimposed, respectively, to the through part 72 of the seventeenth through hole 352 and the through part 72 of the twenty-third through hole 452 in plan view. The through part 72 of the thirteenth through hole 273 is not necessarily superimposed, respectively, to the through part 72 of the eighteenth through hole 353 and the through part 72 of the twenty-fourth through hole 453 in plan view. The through part 72 of the fourteenth through hole 274 is not necessarily superimposed, respectively, to the through part 72 of the nineteenth through hole 354 and the through part 72 of the twenty-fifth through hole 454 in plan view.

Also, among the electrode patterns 33 disposed on the first main surface 311 of the first sealing member 3, it is possible to use the electrode patterns 33 and 33 that are respectively connected to the first and second excitation electrodes 221 and 222 as the test terminals for the vibrating part 23 of the crystal resonator plate 2. In this case, similarly to the case of the above-described crystal resonator 101, it is preferable to dispose the test terminal on an outer side part of each of the electrode patterns 33 and 33 connected to the first and second excitation electrode 221 and 222, i.e. the outer side part that is positioned outside of the internal space 13 in plan view. For example, the electrode patterns 33 and 33 connected to the first and second excitation electrodes 221 and 222 may be formed so as to across the bonding materials 11 (i.e. so as to intersect with the bonding materials 11) in plan view, thus, it is possible to use, as the test terminals, the outer side parts positioned outside the internal space 13.

With the crystal oscillator 102 according to this embodiment, it is possible to obtain functions and effects as specified below, in addition to the above-described functions and effects similar to those of the crystal resonator 101.

The present invention can be embodied in other forms without departing from the spirit, scope or essential characteristics thereof. The foregoing embodiments are therefore to be considered in all respects as illustrative and not restrictive. The scope of the present invention is indicated by the appended claims rather than by the foregoing description. Furthermore, all modifications and changes that come within the meaning and range of equivalency of the claims are intended to be embraced therein.

For example, in the crystal oscillator 102 according to this embodiment as described above, the four external electrode terminals (the first external electrode terminal 433, the second external electrode terminal 434, the third external electrode terminal 435 and the fourth external electrode terminal 436) are provided. However, the present invention is not limited thereto. The present invention can also be applied to the configuration including the desirable number of external electrode terminals such as six terminals or eight terminals.

Figure 19:
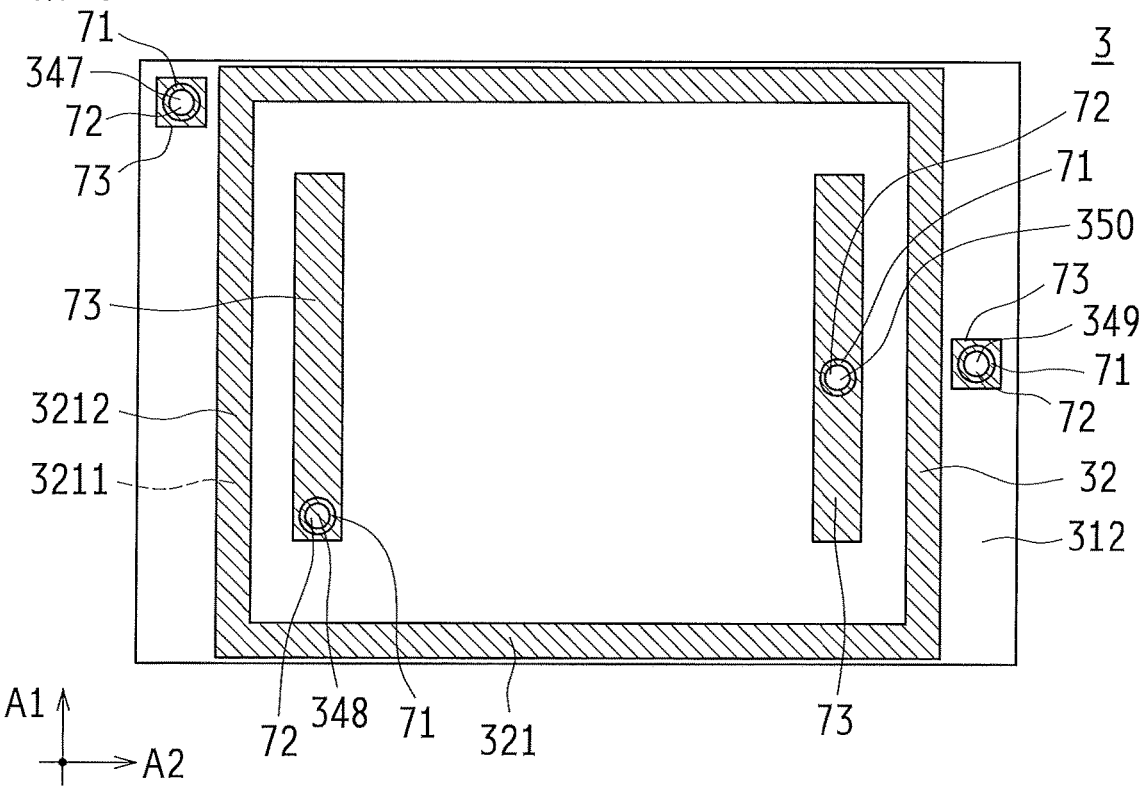
FIG. 19 is a schematic rear view illustrating a variation of the first sealing member of the crystal resonator.
Figure 20:
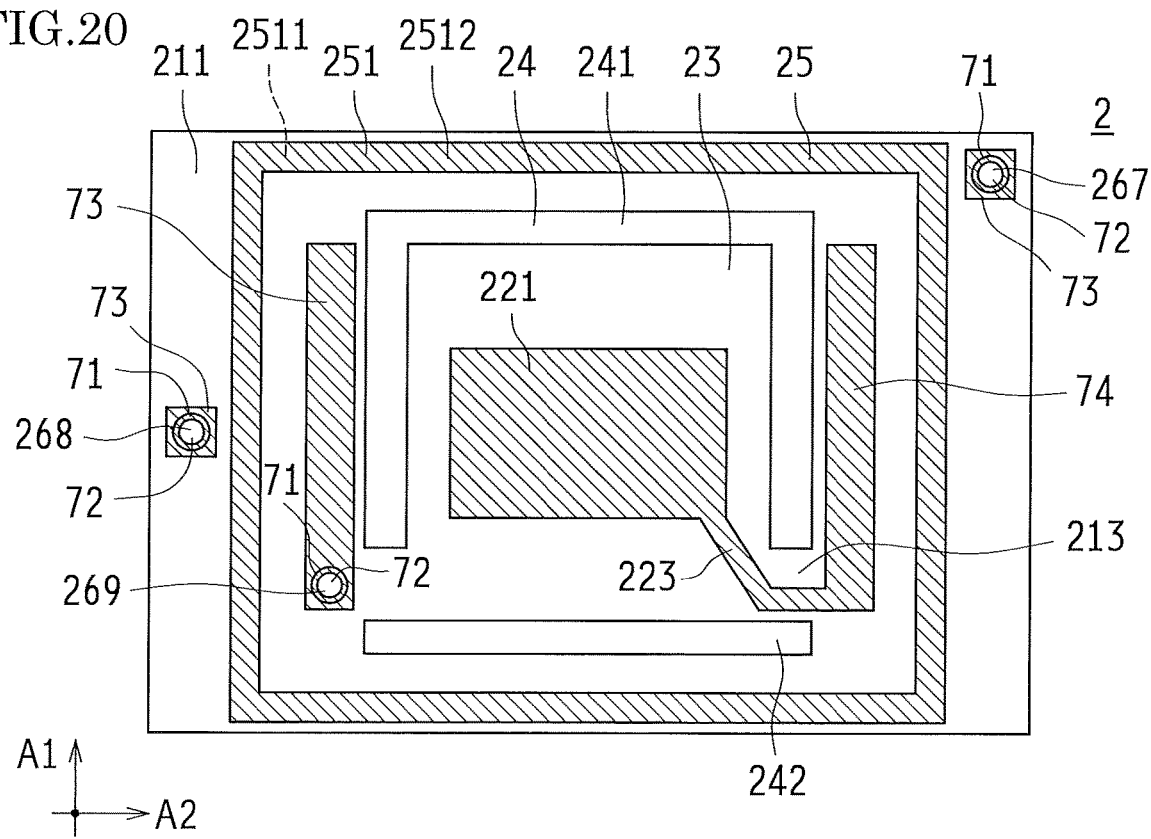
FIG. 20 is a schematic plan view illustrating a variation of the crystal resonator plate of the crystal resonator.

Also, the bonding materials 14, which are formed inside the bonding materials 11 of the above-described crystal resonator 101 and the crystal oscillator 102, may be formed along the bonding materials 11. For example, in the crystal resonator 101 as shown in FIGS. 19 to 22, the connection bonding patterns may be formed on the crystal resonator plate 2, and the first and second sealing members 3 and 4. FIG. 19 is a schematic rear view illustrating a variation of the first sealing member 3 of the crystal resonator 101, which corresponds to FIG. 3. FIG. 20 is a schematic plan view illustrating a variation of the crystal resonator plate 2 of the crystal resonator 101, which corresponds to FIG. 4. FIG. 21 is a schematic rear view illustrating the variation of the crystal resonator plate 2 of the crystal resonator 101, which corresponds to FIG. 5. FIG. 22 is a schematic plan view illustrating a variation of the second sealing member 4 of the crystal resonator 101, which corresponds to FIG. 6.

As shown in FIG. 20, the connection bonding pattern 73 of the third through hole 269, which is formed on the first main surface 211 of the crystal resonator plate 2, extends along the direction A1 in FIG. 20, and is formed between the resonator-plate-side first bonding pattern 251 and the cut-out part 24. Also on the first main surface 211 of the crystal resonator plate 2, a connection bonding pattern 74 to be connected to the first extraction electrode 223 extracted from the first excitation electrode 221 extends along the direction A1 in FIG. 20, and is formed between the resonator-plate-side first bonding pattern 251 and the cut-out part 24. The connection bonding patterns 73 and 74 are disposed on both sides in the direction A2 (i.e. the direction perpendicular to the direction A1) in FIG. 20 with the vibrating part 23 being interposed therebetween. The connection bonding patterns 73 and 74 extend along the short-side direction of the crystal resonator plate 2. Also, the connection bonding patterns 73 and 74 are disposed along the short side of the resonator-plate-side first bonding pattern 251 while being spaced apart from the resonator-plate-side first bonding pattern 251 by a predetermined distance. The outer edge and the inner edge of the resonator-plate-side first bonding pattern 251 each have a substantially rectangular shape.

As shown in FIG. 21, the connection bonding pattern 73 of the third through hole 269, which is formed on the second main surface 212 of the crystal resonator plate 2, extends along the direction A1 in FIG. 21, and is formed between the resonator-plate-side first bonding pattern 251 and the cut-out part 24. The connection bonding pattern 73 of the third through hole 269 is integrally formed with the second extraction electrode 224 extracted from the second excitation electrode 222. On the second main surface 212 of the crystal resonator plate 2, a connection bonding pattern 75 extends along the direction A1 in FIG. 21, and is formed between the resonator-plate-side first bonding pattern 251 and the cut-out part 24. The connection bonding patterns 73 and 75 are disposed on both sides in the direction A2 in FIG. 21 with the vibrating part 23 being interposed therebetween. The connection bonding patterns 73 and 75 extend along the short-side direction of the crystal resonator plate 2. Also, the connection bonding patterns 73 and 75 are disposed along the short side of the resonator-plate-side second bonding pattern 252 while being spaced apart from the resonator-plate-side second bonding pattern 252 by a predetermined distance. The outer edge and the inner edge of the resonator-plate-side second bonding pattern 252 each have a substantially rectangular shape.

As shown in FIG. 19, the connection bonding patterns 73 and 73 of the fifth through hole 348 and the seventh through hole 350, which are formed on the second main surface 312 of the first sealing member 3, extend along the direction A1 in FIG. 19. The connection bonding patterns 73 and 73 extend along the short-side direction of the first sealing member 3. Also, the connection bonding patterns 73 and 73 are disposed along the short side of the sealing-member-side first bonding pattern 321 while being spaced apart from the sealing-member-side first bonding pattern 321 by a predetermined distance. The outer edge and the inner edge of the sealing-member-side first bonding pattern 321 each have a substantially rectangular shape. The connection bonding patterns 73 and 73 are disposed so as to substantially overlap, respectively, with the connection bonding patterns 73 and 74 of the first main surface 211 of the crystal resonator plate 2 in plan view. The interval between the connection bonding patterns 73 and 73 in the direction A2 in FIG. 19 is substantially the same as the interval between the connection bonding patterns 73 and 74 on the first main surface 211 of the crystal resonator plate 2 in the direction A2 (see FIG. 20).

As shown in FIG. 22, on the first main surface 411 of the second sealing member 4, connection bonding patterns 76 and 77 extend in the direction A1 in FIG. 22. The connection bonding patterns 76 and 77 extend along the short-side direction of the second sealing member 4. The connection bonding patterns 76 and 77 are disposed along the short side of the sealing-member-side second bonding pattern 421 while being spaced apart from the sealing-member-side second bonding pattern 421 by a predetermined distance. The outer edge and the inner edge of the sealing-member-side second bonding pattern 421 each have a substantially rectangular shape. The connection bonding patterns 76 and 77 are disposed so as to substantially overlap, respectively, with the connection bonding patterns 73 and 75 on the second main surface 212 of the crystal resonator plate 2 in plan view. The interval between the connection bonding patterns 76 and 77 in the direction A2 in FIG. 22 is substantially the same as the interval between the connection bonding patterns 73 and 75 of the second main surface 212 of the crystal resonator plate 2 in the direction A2 (see FIG. 21).

As described above, when the crystal resonator plate 2, the first sealing member 3 and the second sealing member 4 are laminated, they are bonded in a state in which their respective connection bonding patterns are overlapped with each other. That is, the connection bonding patterns 73 and 74 on the first main surface 211 of the crystal resonator plate 2 are respectively bonded to the connection bonding patterns 73 and 73 of the first sealing member 3. Also, the connection bonding patterns 73 and 75 on the second main surface 212 of the crystal resonator plate 2 are bonded to the connection bonding patterns 76 and 77 of the second sealing member 4.

Figure 23:
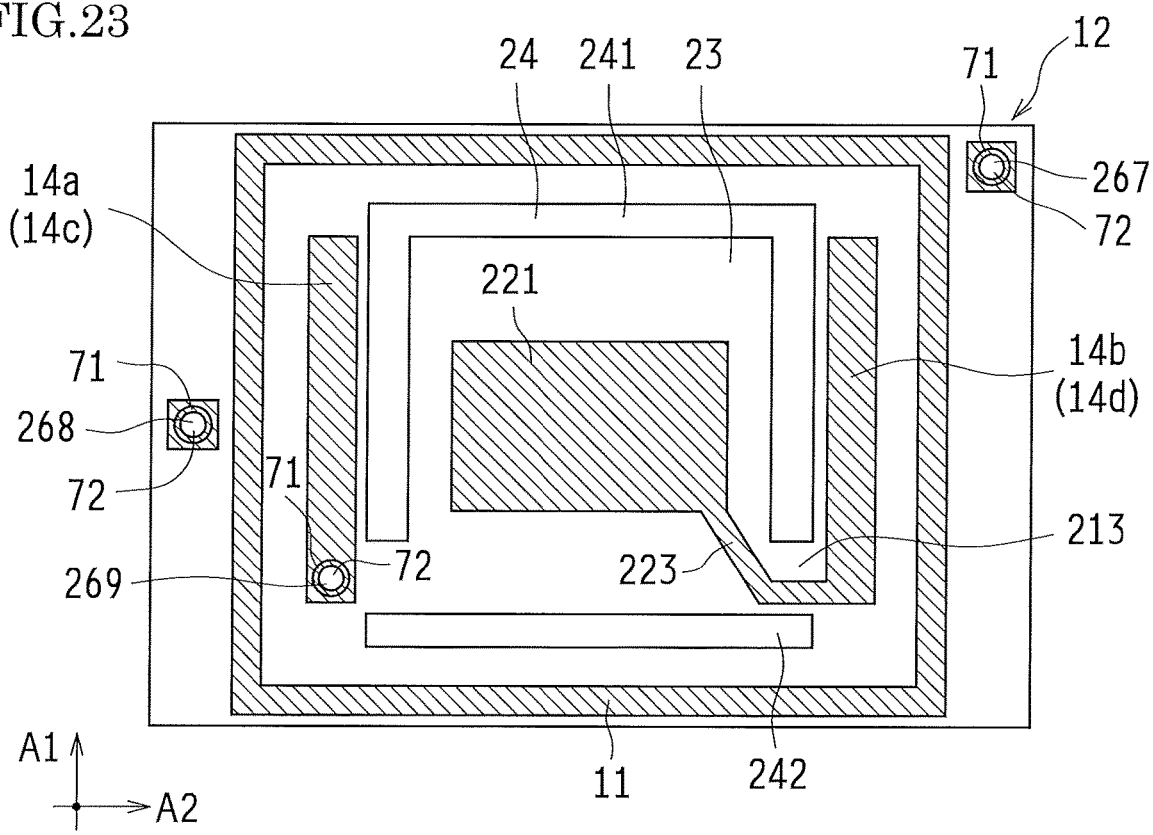
FIG. 23 is a diagram illustrating a positional relationship in plan view of a sealing part and inner sealing parts of the crystal resonator.

Then, as shown in FIG. 23, the connection bonding pattern 73 on the first main surface 211 of the crystal resonator plate 2 and the connection bonding pattern 73 of the first sealing member 3 become a bonding material 14*a* upon bonding. The connection bonding pattern 74 on the first main surface 211 of the crystal resonator plate 2 and the connection bonding pattern 73 of the first sealing member 3 become a bonding material 14*b* upon bonding. The connection bonding pattern 73 on the second main surface 212 of the crystal resonator plate 2 and the connection bonding pattern 76 of the second sealing member 4 become a bonding material 14*c* upon bonding. The connection bonding pattern 75 on the second main surface 212 of the crystal resonator plate 2 and the connection bonding pattern 77 of the second sealing member 4 become a bonding material 14*d* upon bonding.

The bonding materials 14*a* to 14*d* are inner sealing parts each formed inside the bonding material 11 as the sealing part in plan view. Specifically, the bonding materials 14*a* and 14*b* are formed between the crystal resonator plate 2 and the first sealing member 3 inside the inner periphery of the bonding material 11. The bonding materials 14*a* and 14*b* are formed on both sides in the direction A2 in FIG. 23 with the vibrating part 23 of the crystal resonator plate 2 being interposed therebetween. The bonding materials 14*a* and 14*b* are formed adjacent to the respective short sides of the bonding material 11 in plan view, and extend in parallel with the short sides of the bonding material 11. The length (i.e. the length in the direction A1 in FIG. 23) of the bonding materials 14*a* and 14*b* is set to a value not less than 50% of the length of the short side of the bonding material 11.

The bonding materials 14*c* and 14*d* are formed between the crystal resonator plate 2 and the second sealing member 4 inside the inner periphery of the bonding material 11. The bonding materials 14*c* and 14*d* are formed on both sides in the direction A2 with the vibrating part 23 of the crystal resonator plate 2 being interposed therebetween. The bonding materials 14*c* and 14*d* are formed adjacent to the respective short sides of the bonding material 11 in plan view, and extend in parallel with the short sides of the bonding material 11. The length (i.e. the length in the direction A1) of the bonding materials 14*b* and 14*d* is set to a value not less than 50% of the length of the short side of the bonding material 11.

The bonding material 14*a* on the first main surface 211 of the crystal resonator plate 2 and the bonding material 14*c* on the second main surface 212 of the crystal resonator plate 2 are disposed so as to substantially overlap with each other in plan view. Also, the bonding material 14*b* on the first main surface 211 of the crystal resonator plate 2 and the bonding material 14d on the second main surface 212 of the crystal resonator plate 2 are disposed so as to substantially overlap with each other in plan view.

By reducing the interval between the respective bonding materials 14a to 14d and the respective short sides of the bonding materials 11 whose outer edge and inner edge have a substantially rectangular shape, it is possible to prevent the first sealing member 3 and the second sealing member 4 from deforming (bending) when a pressure is applied at the time of bonding. That is, since the first sealing member 3 is supported by the short sides of the bonding material 11 and the bonding materials 14a and 14b relative to the crystal resonator plate 2, the deformation of the first sealing member 3 can be prevented. Also, since the second sealing member 4 is supported by the bonding material 11 and the bonding materials 14c and 14d relative to the crystal resonator plate 2, the deformation of the second sealing member 4 can be prevented. Therefore, it is possible to suppress decrease in the bonding strength of the bonding materials 11 that seal the vibrating part 23 of the crystal resonator plate 2, which is caused by the deformation of the first sealing member 3 and/or the second sealing member 4. Thus, it is possible to suppress decrease in the hermeticity of the internal space 13 caused by the bonding materials 11.

Figure 24:
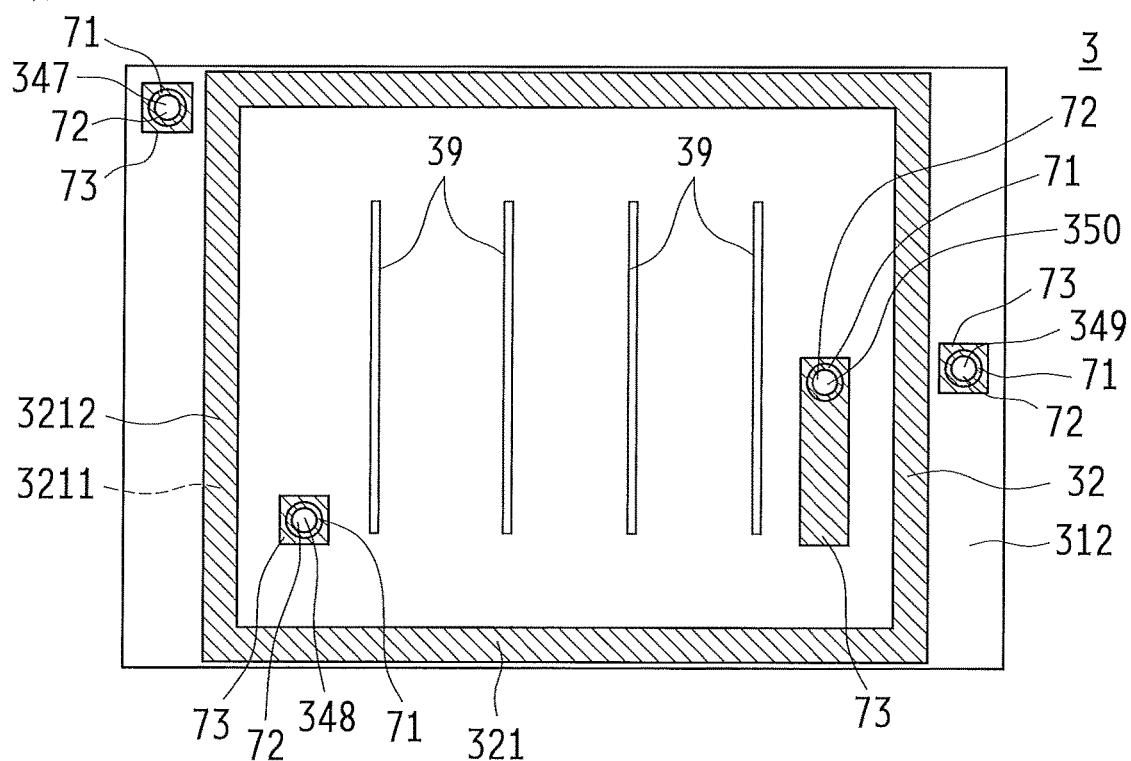
FIG. 24 is a schematic rear view illustrating another variation of the first sealing member of the crystal resonator.

Also, the above-described crystal resonator 101 and the crystal oscillator 102 may include grooves 39 in the second main surface 312 of the first sealing member 3, as shown in FIG. 24. In the example shown in FIG. 24, four grooves 39 linearly extending are formed in the second main surface 312 of the first sealing member 3. The four grooves 39 are arranged in parallel to one another at predetermined intervals. The four grooves 39 extend in parallel to the short side direction of the first sealing member 3. The four grooves 39 are formed in the surface of the first sealing member 3 so as to face the internal space 13. The grooves 39 are formed in the second main surface 312 of the first sealing member 3, preferably by wet etching or dry etching. Also, it is possible to form the grooves 39 in the second main surface 312 of the first sealing member 3 by a method such as laser processing.

These grooves 39 serve as an adjusting part for adjusting the natural frequency of the package 12. That is, by adjusting the number, shape, size and the like of the grooves 39, the natural frequency of the package 12 can easily be adjusted. Thus, by adjusting the natural frequency of the package 12 by the grooves 39, it is possible to easily differentiate the natural frequency of the package 12 from the frequency of vibration that leaks from the vibrating part 23 of the crystal resonator plate 2 to the package 12. As a result, it is possible to suppress the resonance of the package 12 caused by the vibration that leaks from the vibrating part 23 of the crystal resonator plate 2 to the package 12.

Here, the first sealing member 3, the crystal resonator plate 2 and the second sealing member 4 are laminated and bonded without using any conductive adhesive. Thus, the vibration of the vibrating part 23 of the crystal resonator plate 2 is likely to leak to the package 12 compared to the case in which the conductive adhesive is used. For this reason, the package 12 may resonate with the vibrating part 23 because of the leakage of vibration from the vibrating part 23 of the crystal resonator plate 2 to the package 12. However, by adjusting the natural frequency of the package 12 by the grooves 39, it is possible to differentiate the natural frequency of the package 12 from the frequency of vibration that leaks from the vibrating part 23 of the crystal resonator plate 2 to the package 12. Consequently, it is possible to suppress the resonance of the package 12 caused by the vibration that leaks from the vibrating part 23 of the crystal resonator plate 2 to the outside.

Also, since the grooves 39 are formed in the second main surface 312 of the first sealing member 3 so as to face the internal space 13, the grooves 39 are protected by the package 12. Thus, the changes in the shape, size and the like of the grooves 39 caused by the contact of the package 12 with the outside can be prevented, accordingly, there is no need to adjust the natural frequency of the package 12 according to the changes in the shape, size and the like of the grooves 39. Furthermore, it is possible to improve the degree of freedom in the wiring on the first main surface 311 of the first sealing member 3 to connect to the external elements. Thus, the area necessary to the wiring can easily be saved.

It is possible to suitably change the number, shape, size and the like of the grooves 39. Also, the grooves can be disposed in the first main surface 411 of the second sealing member 4 so as to face the internal space 13, in place of the second main surface 312 of the first sealing member 3. Alternatively, the grooves can be disposed in both the second main surface 312 of the first sealing member 3 and the first main surface 411 of the second sealing member 4 so as to face the internal space 13. Regarding the adjusting part for adjusting the natural frequency of the package 12, it is possible to adopt the adjusting part other than the grooves, e.g. bottomed holes. Also, as such an adjusting part, it is also possible to use a protrusion or a step (step part) formed on at least one of the first sealing member 3 and the second sealing member 4, or a weight fixed on at least one of the first sealing member 3 and the second sealing member 4. The natural frequency of the package 12 can also be adjusted using a load mass such as a vapor deposited film formed on at least one of the first sealing member 3 and the second sealing member 4. Further, the natural frequency of the package 12 can be adjusted by changing the thickness of the at least one of the first sealing member 3 and the second sealing member 4.

This application claims priority based on Patent Application No. 2015-036708 filed in Japan on Feb. 26, 2015. The entire contents thereof are hereby incorporated in this application by reference.

INDUSTRIAL APPLICABILITY

The present invention is suitable for a crystal resonator device (such as a crystal resonator and a crystal oscillator) using a crystal for the material of a substrate of a piezoelectric resonator plate.

DESCRIPTION OF REFERENCE NUMERALS

101 Crystal resonator
102 Crystal oscillator
13 Internal space
2 Crystal resonator plate
211 First main surface
212 Second main surface
221 First excitation electrode
222 Second excitation electrode
23 Vibrating part
269 Third through hole
3 First sealing member
311 First main surface
312 Second main surface
350 Seventh through hole
4 Second sealing member
71 Through electrode
72 Through part

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate,
wherein through holes for the piezoelectric resonator plate are formed in the piezoelectric resonator plate so as to penetrate between the first main surface and the second main surface, the through holes for the piezoelectric resonator plate including: respective through electrodes for establishing conduction between electrodes formed on the first main surface and the second main surface; and respective through parts, and the through electrodes are conducted to either one of the first excitation electrode and the second excitation electrode,
wherein through holes for the first sealing member are formed in the first sealing member so as to penetrate between a first main surface and a second main surface thereof, the through holes for the first sealing member including: respective through electrodes for establishing conduction between electrodes formed on the first main surface and the second main surface; and respective through parts, and
wherein the through electrodes of the through holes for the piezoelectric resonator plate are conducted to the through electrodes of the through holes for the first sealing member while the through holes for the piezoelectric resonator plate are not superimposed to the through holes for the first sealing member in plan view.

2. The piezoelectric resonator device according to claim 1,
wherein the through electrodes of the through holes for the piezoelectric resonator plate are conducted to the through electrodes of the through holes for the first sealing member by bonding a bonding pattern formed on the first main surface of the piezoelectric resonator plate so as to surround the through hole for the piezoelectric resonator plate to a bonding pattern formed on the second main surface of the first sealing member so as to surround the through holes for the first sealing member.

3. The piezoelectric resonator device according to claim 2,
wherein the bonding pattern of the piezoelectric resonator plate is constituted by a base PVD film deposited on the first main surface of the piezoelectric resonator plate by physical vapor deposition, and an electrode PVD film deposited on the base PVD film by physical vapor deposition,
wherein the bonding pattern of the first sealing member is constituted by a base PVD film deposited on the second main surface of the first sealing member by physical vapor deposition, and an electrode PVD film deposited on the base PVD film by physical vapor deposition, and
wherein the bonding pattern of the piezoelectric resonator plate and the bonding pattern of the first sealing member are bonded to each other by diffusion bonding.

4. The piezoelectric resonator device according to claim 1,
wherein at least a first external electrode terminal and a second external electrode terminal are disposed on a second main surface of the second sealing member so as to be electrically connected to an external circuit board using a flowable conductive bonding material,
wherein the first excitation electrode of the piezoelectric resonator plate is connected to the first external electrode terminal of the second sealing member via a first terminal formed on the first main surface of the first sealing member, and
wherein the second excitation electrode of the piezoelectric resonator plate is connected to the second external electrode terminal of the second sealing member via a second terminal formed on the first main surface of the first sealing member.

5. The piezoelectric resonator device according to claim 4,
wherein a first electrical path and a second electrical path are formed outside sealing parts that hermetically seal the vibrating part of the piezoelectric resonator plate in plan view, the first electrical path conducting the first terminal to the first external electrode terminal, and the second electrical path conducting the second terminal to the second external electrode terminal.

6. The piezoelectric resonator device according to claim 5,
wherein the first electrical path and the second electrical path are not electrically connected to the sealing parts.

7. The piezoelectric resonator device according to claim 4,
wherein the first terminal and the second terminal include respective outer side parts that are positioned outside the internal space in plan view, and the outer side parts are used as test terminals for the vibrating part of the piezoelectric resonator plate.

8. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate, and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate,
wherein the first excitation electrode and the second excitation electrode are not electrically connected to sealing parts that hermetically seal the vibrating part of the piezoelectric resonator plate.

9. The piezoelectric resonator device according to claim 8,
wherein a through hole for the piezoelectric resonator plate is formed in the piezoelectric resonator plate so as to penetrate between the first main surface and the second main surface, the through hole for the piezoelectric resonator plate including: a through electrode for establishing conduction between electrodes formed on the first main surface and the second main surface; and a through part, and the through electrode is conducted to the second excitation electrode,
wherein a through hole for the first sealing member is formed in the first sealing member so as to penetrate between a first main surface and a second main surface thereof, the through hole for the first sealing member including: a through electrode for establishing conduction between electrodes formed on the first main surface and the second main surface; and a through part, and the through electrode is conducted to the first excitation electrode of the piezoelectric resonator plate, and
wherein the through hole for the piezoelectric resonator plate and the through hole for the first sealing member are formed inside the sealing parts in plan view.

10. The piezoelectric resonator device according to claim 9,
wherein another through hole for the first sealing member is formed in the first sealing member so as to penetrate between the first main surface and the second main surface thereof, the through hole for the first sealing member including: a through electrode for establishing conduction between electrodes formed on the first main surface and the second main surface; and a through part, and the through electrode is conducted to a corresponding through electrode of the through hole for the piezoelectric resonator plate, and
wherein the corresponding through hole for the piezoelectric resonator plate is not superimposed to the through hole for the first sealing member in plan view.

11. The piezoelectric resonator device according to claim 8,
wherein a first terminal and a second terminal are formed on a first main surface of the first sealing member so as to across from an inside to an outside of the sealing parts in plan view,
wherein at least a first external electrode terminal and a second external electrode terminal are disposed on a second main surface of the second sealing member so as to be electrically connected to an external circuit board using a flowable conductive bonding material,
wherein the first excitation electrode of the piezoelectric resonator plate is connected to the first terminal of the first sealing member via a third electrical path disposed inside the sealing parts in plan view, and the first terminal is connected to the first external electrode terminal of the second sealing member via a first electrical path disposed outside the sealing parts in plan view, and
wherein the second excitation electrode of the piezoelectric resonator plate is connected to the second terminal of the second sealing member via a fourth electrical path disposed inside the sealing parts in plan view, and the second terminal is connected to the second external electrode terminal of the second sealing member via a second electrical path disposed outside the sealing parts in plan view.

12. The piezoelectric resonator device according to claim 11,
wherein the first terminal and the second terminal include respective parts that are positioned outside the internal space in plan view, and the parts are used as test terminals for the vibrating part of the piezoelectric resonator plate.

13. The piezoelectric resonator device according to claim 8,
wherein at least a first external electrode terminal and a second external electrode terminal are disposed on a second main surface of the second sealing member so as to be electrically connected to an external circuit board using a flowable conductive bonding material,
wherein the first excitation electrode of the piezoelectric resonator plate is connected to the first external electrode terminal of the second sealing member via a first terminal formed on the first main surface of the first sealing member, and
wherein the second excitation electrode of the piezoelectric resonator plate is connected to the second external electrode terminal of the second sealing member via a second terminal formed on the first main surface of the first sealing member.

14. The piezoelectric resonator device according to claim 13,
wherein a first electrical path and a second electrical path are formed outside sealing parts that hermetically seal the vibrating part of the piezoelectric resonator plate in plan view, the first electrical path conducting the first terminal to the first external electrode terminal, and the second electrical path conducting the second terminal to the second external electrode terminal.

15. The piezoelectric resonator device according to claim 14,
wherein the first electrical path and the second electrical path are not electrically connected to the sealing parts.

16. The piezoelectric resonator device according to claim 13,
wherein the first terminal and the second terminal include respective outer side parts that are positioned outside the internal space in plan view, and the outer side parts are used as test terminals for the vibrating part of the piezoelectric resonator plate.

* * * * *